(12) United States Patent
Ochiai

(10) Patent No.: US 10,636,456 B2
(45) Date of Patent: Apr. 28, 2020

(54) SEMICONDUCTOR STORAGE DEVICE AND METHOD OF CONTROLLING THE SEMICONDUCTOR STORAGE DEVICE TO MINIMIZE FAILURES IN DATA WRITING

(71) Applicant: SONY CORPORATION, Tokyo (JP)

(72) Inventor: Yasuhiro Ochiai, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 16/064,617

(22) PCT Filed: Nov. 9, 2016

(86) PCT No.: PCT/JP2016/083259
§ 371 (c)(1),
(2) Date: Jun. 21, 2018

(87) PCT Pub. No.: WO2017/122418
PCT Pub. Date: Jul. 20, 2017

(65) Prior Publication Data
US 2018/0374516 A1    Dec. 27, 2018

(30) Foreign Application Priority Data

Jan. 12, 2016 (JP) ................................ 2016-003325

(51) Int. Cl.
*G11C 5/14* (2006.01)
*G11C 11/419* (2006.01)
(Continued)

(52) U.S. Cl.
CPC .............. *G11C 5/145* (2013.01); *G11C 5/147* (2013.01); *G11C 11/413* (2013.01); *G11C 11/419* (2013.01); *G11C 11/417* (2013.01)

(58) Field of Classification Search
CPC ....... G11C 5/145; G11C 5/147; G11C 11/413; G11C 11/419; G11C 11/417
See application file for complete search history.

(56) References Cited

U.S. PATENT DOCUMENTS 5,903,498 A * 5/1999 Campardo ............. G11C 16/08
365/185.11
9,236,116 B1 * 1/2016 Braceras ............... G11C 11/419
(Continued)

FOREIGN PATENT DOCUMENTS

CN    101465160 A    6/2009
CN    102057437 A    5/2011
(Continued)

OTHER PUBLICATIONS

Translation of JP2002237192A, Aug. 2002. (Year: 2002).*
(Continued)

*Primary Examiner* — Mushfique Siddique
(74) *Attorney, Agent, or Firm* — Chip Law Group

(57) ABSTRACT

To minimize failures in data writing in a semiconductor storage device in which a transistor is provided for each memory cell. A first transistor has a gate connected to a gate signal line and a source connected to a first source signal line. A second transistor has a gate connected to the gate signal line and a source connected to a second source signal line. A storage element is connected to drains of the first transistor and the second transistor. A gate signal line potential control unit controls a potential of the gate signal line such that the potential becomes a predetermined high potential that is higher than a predetermined reference potential in a case in which the storage element is caused to store data. A source signal line potential control unit causes one of the potentials of the first source signal line and the second signal line to drop such that the one of the potentials becomes lower than the predetermined reference potential, on a basis of the data. A potential fixing unit fixes the one of the potentials at a specific potential in a case in which the one of the potentials has dropped and reached the specific (Continued)

potential that is lower than the predetermined reference potential.

8 Claims, 24 Drawing Sheets

(51) Int. Cl.
*G11C 11/413* (2006.01)
*G11C 11/417* (2006.01)

(56) References Cited

U.S. PATENT DOCUMENTS

| | | | |
|---|---|---|---|
| 2002/0001207 A1 | 1/2002 | Kishimoto et al. | |
| 2002/0036924 A1 | 3/2002 | Tanzawa | |
| 2005/0213387 A1* | 9/2005 | Kubo | G11C 5/145 365/185.21 |
| 2008/0048767 A1* | 2/2008 | Kobayashi | G11C 5/147 327/538 |
| 2009/0161449 A1 | 6/2009 | Yamagami | |
| 2010/0188909 A1* | 7/2010 | Kenkare | G11C 11/419 365/189.16 |
| 2011/0032779 A1 | 2/2011 | Aihara et al. | |
| 2016/0365849 A1* | 12/2016 | Moscaluk | G11C 11/2297 |

FOREIGN PATENT DOCUMENTS

| | | |
|---|---|---|
| JP | 2002-026254 A | 1/2002 |
| JP | 2002-101644 A | 4/2002 |
| JP | 2002-237192 A | 8/2002 |
| JP | 2009-151847 A | 7/2009 |
| JP | 2009-295246 A | 12/2009 |
| JP | 2010-257554 A | 11/2010 |
| WO | 2010/125718 A1 | 11/2010 |

OTHER PUBLICATIONS

International Search Report and Written Opinion of PCT Application No. PCT/JP2016/083259, dated Feb. 14, 2017, 11 pages of ISRWO.

* cited by examiner

SEMICONDUCTOR STORAGE DEVICE AND METHOD OF CONTROLLING THE SEMICONDUCTOR STORAGE DEVICE TO MINIMIZE FAILURES IN DATA WRITING

CROSS REFERENCE TO RELATED APPLICATIONS

This application is a U.S. National Phase of International Patent Application No. PCT/JP2016/083259 filed on Nov. 9, 2016, which claims priority benefit of Japanese Patent Application No. JP 2016-003325 filed in the Japan Patent Office on Jan. 12, 2016. Each of the above-referenced applications is hereby incorporated herein by reference in its entirety.

TECHNICAL FIELD

The present technology relates to a semiconductor storage device and a method of controlling the semiconductor storage device. Specifically, the present technology relates to a semiconductor storage device in which a transistor is provided for each memory cell and a method of controlling the semiconductor storage device.

BACKGROUND ART

In the related art, a semiconductor storage device such as a static random access memory (SRAM) is used to hold data in an information processing system. The semiconductor storage device includes, for example, a plurality of memory cells and a control circuit. In addition, each of the memory cells is connected to a word line and a pair of bit lines. Also, each of the memory cells is provided with a transistor that has a gate and a source connected to the word line and the bit lines and a storage element. A control circuit controls the word line of a memory cell, which is a destination of writing, such that it is brought to a high level (a power source potential VDD or the like) and controls the other word lines such that they are brought to a low level (reference potential VSS or the like). In addition, the control circuit controls one of the pair of bit lines such that it is brought to a high level (the VDD or the like) and controls the other such that it is brought to a low level (the VSS or the like) on the basis of a value of data to be written. Through the control, the transistor in the memory cell, which is the destination of writing, is shifted to an ON state, and data is written in the storage element.

In a system using the semiconductor storage device with the aforementioned configuration, there is concern that a data writing operation may become unstable if the power source potential VDD is caused to drop for the purpose of reducing power consumption. For example, a voltage between the gate and the source of the transistor may drop due to a drop of the power source potential VDD, and the transistor, which is to be brought into an ON state, may remain in an OFF state. Thus, a semiconductor storage device that relatively increases the voltage between the gate and the source of the transistor by setting the potential of a bit line connected to the source of the transistor to be lower than the reference potential VSS has been proposed (see Patent Literature 1, for example).

CITATION LIST

Patent Literature

Patent Literature 1: JP 2009-295246A

DISCLOSURE OF INVENTION

Technical Problem

In the aforementioned semiconductor storage device, a capacitance of the bit lines varies in accordance with the number of word lines. There is a concern that if the potential of the bit lines become excessively low due to this variation, the voltage between the gate and the source of the transistor in the memory cell, which is the destination of writing, may exceed an insulation breakdown voltage, and insulation breakdown of a gate oxide film may occur. In addition, there is a concern that a voltage between a gate and a source of a transistor in a memory cell, which is not the destination of writing, may exceed a threshold voltage, and data may be erroneously written therein. This leads to a result of a failure in data writing.

Although there is a method of stabilizing the entire capacitance by adding a new wiring layer and using a wiring capacitance with a large capacitance value between the wiring in the wiring layer and the bit lines as a method of suppressing variation in the potential of the bit lines, there is concern that more resources will be used for the wiring and it may be difficult to manufacture the semiconductor storage device according to this method. In this manner, there is a problem that it is difficult to minimize failures in data writing in the aforementioned semiconductor storage device.

The present technology has been achieved in view of such circumstances, and an object thereof is to minimize failures in data writing in a semiconductor storage device in which a transistor is provided for each memory cell.

Solution to Problem

The present technology has been devised to solve the above-described problem, and a first aspect thereof is a semiconductor storage device including: a first transistor that has a gate connected to a gate signal line and a source connected to a first source signal line; a second transistor that has a gate connected to the gate signal line and a source connected to a second source signal line; a storage element that is connected to drains of the first transistor and the second transistor; a gate signal line potential control unit that controls a potential of the gate signal line such that the potential becomes a predetermined high potential that is higher than a predetermined reference potential in a case in which the storage element is caused to store data; a source signal line potential control unit that causes one of the potentials of the first source signal line and the second signal line to drop such that the one of the potentials becomes lower than the predetermined reference potential, on a basis of the data; and a potential fixing unit that fixes the one of the potentials at a specific potential in a case in which the one of the potentials has dropped and reached the specific potential that is lower than the predetermined reference potential, and a method of controlling the same. This leads to an effect that in a case in which a potential of one of a first source signal line and a second source signal line has dropped and reached a specific potential, the potential is fixed at the specific potential.

In addition, according to the first aspect, a detection unit that detects that the one of the potentials has reached the specific potential and supplies a detection signal indicating a result of the detection to the potential fixing unit may be further included. The potential fixing unit may fix the one of the potentials at the specific potential in a case in which the detection signal is supplied. This leads to an effect that the event in which the potential of one of the first source signal line and the second source signal line has dropped and reached the specific potential is detected.

In addition, according to this first aspect, the source signal line potential control unit may include a first charge pump circuit that uses a first capacitance connected to the first source signal line and the second source signal line to cause the one of the potentials to drop if an instruction signal for providing an instruction for dropping the potential of the first source signal line or the second source signal line is supplied, and a second charge pump circuit that uses a second capacitance connected to the first source signal line and the second source signal line to cause the one of the potentials to drop if a delay signal obtained by causing the instruction signal to be delayed is supplied. This leads to an effect that the potential decreases due to a first charge pump circuit and the potential then decreases due to a second charge pump circuit.

In addition, according to the first aspect, the first charge pump circuit may cause the one of the potentials to drop if a first charge pump enabling signal indicating that the first charge pump circuit is to be enabled and the instruction signal are supplied. The second charge pump circuit may cause the one of the potential to drop if a second charge pump enabling signal indicating that the second charge pump circuit is to be enabled and the delay signal are supplied. This leads to an effect that the charge pump circuits operate in accordance with a charge pump enabling signal.

In addition, according to the first aspect, the detection unit may adjust a value of the specific potential on a basis of an adjustment signal indicating an adjusted value of the specific potential. This leads to an effect that the specific potential is adjusted.

In addition, according to the first aspect, the detection unit may detect that the one of the potentials has reached the specific potential in a case in which a detection enabling signal indicating that the detection unit is to be enabled is supplied. This leads to an effect that a detection unit operates in accordance with a detection enabling signal.

In addition, according to the first aspect, a stop control unit that causes the first charge pump circuit and the second charge pump circuit to stop in a case in which the potential of the first source signal line or the second source signal line has reached the specific potential may be further included. This leads to an effect that in a case in which a potential of a source signal line has reached a specific potential, the first charge pump circuit and the second charge pump circuit stop.

In addition, according to the first aspect, the first capacitance and the second capacitance may be metal oxide semiconductor (MOS) capacitors. This leads to an effect that a potential of a value in accordance with an MOS capacitor is controlled.

Advantageous Effects of Invention

According to the present technology, an excellent effect that it is possible to minimize data writing failures in a semiconductor storage device in which a transistor is provided for each memory cell can be achieved. Note that the effects described here are not necessarily limited, and any effect that is desired to be described in the present disclosure may be exhibited.

MODE(S) FOR CARRYING OUT THE INVENTION

Hereinafter, embodiments for realizing the present technology (hereinafter, referred to as embodiments) will be described. The description will be given in the following order.
1. First embodiment (example in which potential of bit lines is controlled such that it becomes equal to or greater than fixed potential)
2. Second embodiment (example in which enabling signal is supplied to charge pump circuit and potential of bit lines is controlled such that it becomes equal to or greater than fixed potential)
3. Third embodiment (example in which fixed potential is adjusted and potential of bit lines is controlled such that it becomes equal to or greater than fixed potential)
4. Fourth embodiment (example in which enabling signal is supplied to negative potential detection circuit and potential of bit lines is controlled such that it becomes equal to or greater than fixed potential)
5. Fifth embodiment (example in which potential of bit lines is controlled such that it becomes equal to or greater than fixed potential and charge pump circuit is caused to stop)

1. First Embodiment

Figure 1:
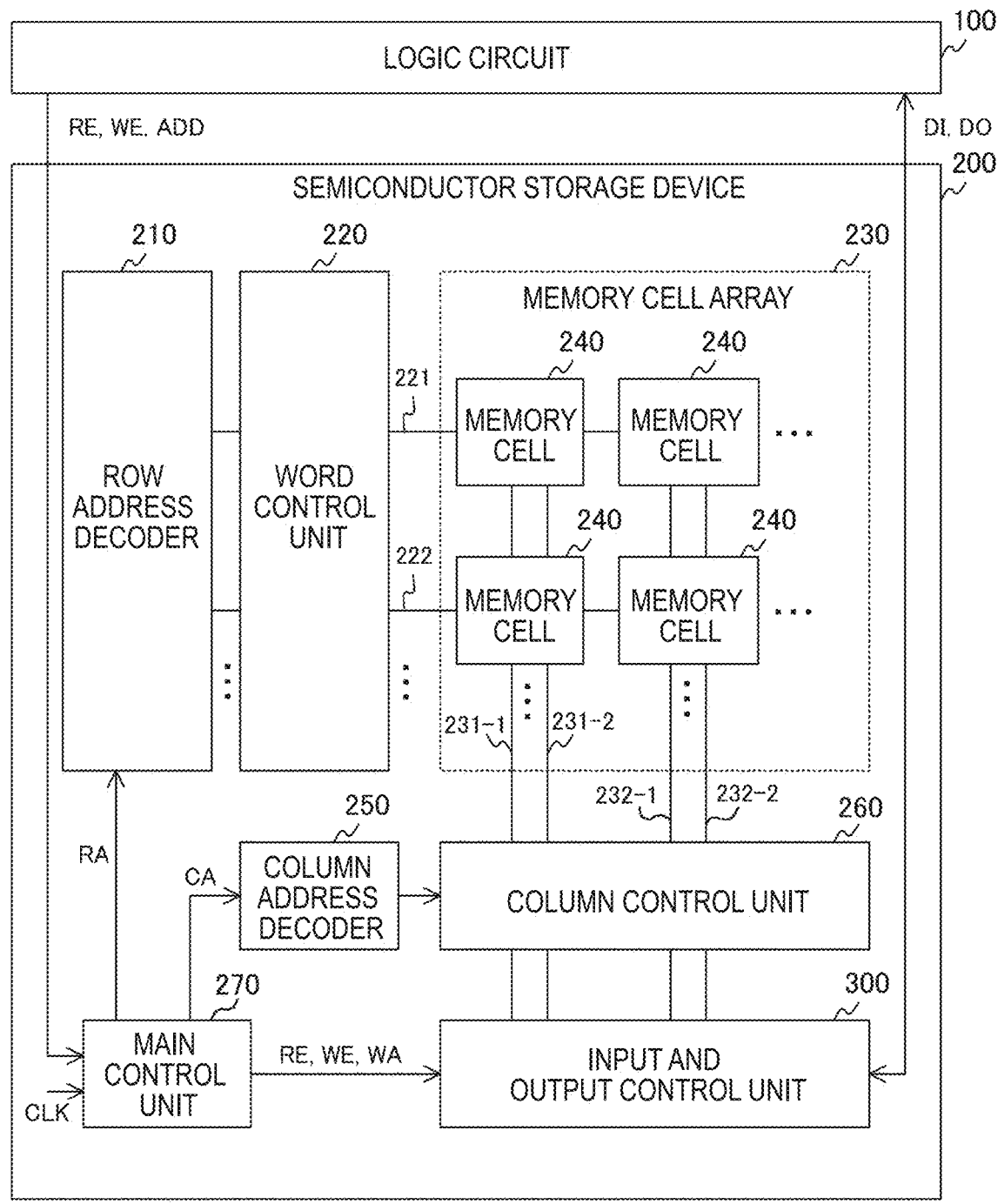
FIG. 1 is a block diagram illustrating a configuration example of a logic circuit and a semiconductor storage device according to a first embodiment of the present technology.

[Configuration Example of Semiconductor Storage Device]
FIG. 1 is a block diagram illustrating a configuration example of a logic circuit 100 and a semiconductor storage device 200 according to a first embodiment. The semiconductor storage device 200 is a semiconductor memory that stores data by using a sequential circuit and is also referred to as an SRAM. As apparatuses in each of which the logic circuit 100 and the semiconductor storage device 200 are provided, a variety of electronic apparatuses using the semiconductor storage device 200 as a cache memory are assumed. As such electronic apparatuses, a central processing unit (CPU), a hard disk drive (HDD), and the like are assumed. The semiconductor storage device 200 includes a row address decoder 210, a word control unit 220, a memory cell array 230, a column address decoder 250, a column control unit 260, a main control unit 270, and an input and output control unit 300.

The logic circuit 100 is for accessing the semiconductor storage device 200 and writing data therein and reading data therefrom. The logic circuit 100 supplies a writing enabling signal WE, written data DI, and an address ADD to the semiconductor storage device 200 in a case in which data writing is performed. The writing enabling signal WE is a signal indicating that writing in the semiconductor storage device 200 is to be enabled. The writing enabling signal WE is set at a high level in a case in which writing is performed and is otherwise set at a low level, for example. The address ADD represents a physical address of an access destination.

In addition, the logic circuit 100 supplies a reading enabling signal RE and an address ADD to the semiconductor storage device 200 in a case in which data reading is performed. The reading enabling signal RE is a signal indicating that reading from the semiconductor storage device 200 is to be enabled. Then, the logic circuit 100 receives read data DO read from the semiconductor storage device 200.

A plurality of memory cells 240 are aligned in a two-dimensional grid shape in the memory cell array 230. Hereinafter, groups of the memory cells 240 aligned in a predetermined direction will be referred to as "columns", and groups of the memory cells 240 aligned in a direction perpendicular to the column will be referred to as "rows". In addition, physical addresses are assigned to the respective memory cells 240. Also, the respective memory cells 240 that belong to the m-th (m is an integer) row are connected to a word line 22$m$. The respective memory cells 240 that belong to the n-th (n is an integer) column are connected to a pair of bit lines 23$n$-1 and 23$n$-2, and these bit lines are used for delivering a differential signal.

The main control unit 270 controls the entire semiconductor storage device 200. The main control unit 270 divides the address ADD to a row address RA and a column address CA. Here, the row address RA indicates a position of a row of the access destination. In addition, the column address CA indicates a position of a column of the access destination. Then main control unit 270 supplies the row address RA to the row address decoder 210 and supplies the column address CA to the column address decoder 250.

In addition, the main control unit 270 holds the writing enabling signal WE or the reading enabling signal RE in synchronization with a clock signal CLK and supplies the writing enabling signal WE or the reading enabling signal RE to the input and output control unit 300. Then, the main control unit 270 generates a writing assist activation signal WA after elapse of a predetermined time from reception of the writing enabling signal WE and supplies the writing assist activation signal WA to the input and output control unit 300. The writing assist activation signal WA is a signal indicating that one of potentials of the pair of bit lines is to be set to be lower than a predetermined reference potential VSS. As the writing assist activation signal WA, a high-level signal is used, for example. In addition, the reference potential VSS is a potential that is lower than a power source potential VDD and is 0 volts (V), for example.

The row address decoder 210 analyzes the row address RA and supplies a result of the analysis to the word control unit 220. The word control unit 220 controls the potentials of the word lines on the basis of the result of analyzing the row address RA. The word control unit 220 supplies the power source potential VDD to a word line at the row of the access destination and supplies the reference potential VSS to word lines at rows other than that of the access destination.

The column address decoder 250 analyzes the column address CA and supplies a result of the analysis to the column control unit 260. The column control unit 260 controls switching elements that are inserted into the respective bit lines on the basis of the result of analyzing the column address RA. The column control unit 260 controls a switching element of a bit line on the column of the access destination such that the switching element is brought into a closed state and controls switching elements of bit lines at columns other than that of the access destination such that the switching elements are brought into an open state.

The input and output control unit 300 writes data or reads data. The input and output control unit 300 writes the written data DI in the memory cell 240 indicated by the address ADD in accordance with the writing enabling signal WE and the writing assist activation signal WA. In addition, the input and output control unit 300 reads the read data DO from the memory cell 240 indicated by the address ADD and supplies the read data DO to the logic circuit 100 in accordance with the reading enabling signal RE.

[Configuration Example of Main Control Unit]

Figure 2:
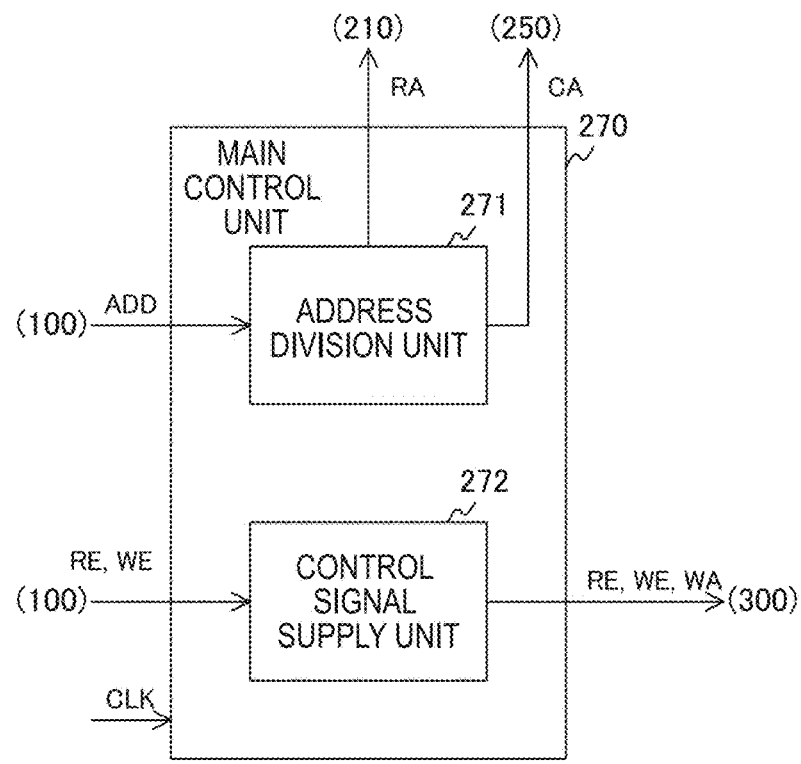
FIG. 2 is a block diagram illustrating a configuration example of a main control unit according to the first embodiment of the present technology.

FIG. 2 is a block diagram illustrating a configuration example of the main control unit 270 according to the first embodiment. The main control unit 270 includes an address division unit 271 and a control signal supply unit 272.

The address division unit 271 divides the address ADD into the row address RA and the column address CA. The address division unit 271 supplies the row address RA to the row address decoder 210 and supplies the column address CA to the column address decoder 250.

The control signal supply unit 272 supplies control signals such as a writing enabling signal WE. The control signal supply unit 272 holds the writing enabling signal WE or the reading enabling signal RE in synchronization with the clock signal CLK and supplies the writing enabling signal WE or the reading enabling signal RE to the input and output control unit 300. In addition, the control signal supply unit 272 generates the writing assist activation signal WA after elapse of a predetermined time from reception of the writing enabling signal WE and supplies the writing assist activation signal WA to the input and output control unit 300.

[Configuration Example of Memory Cell]

Figure 3:
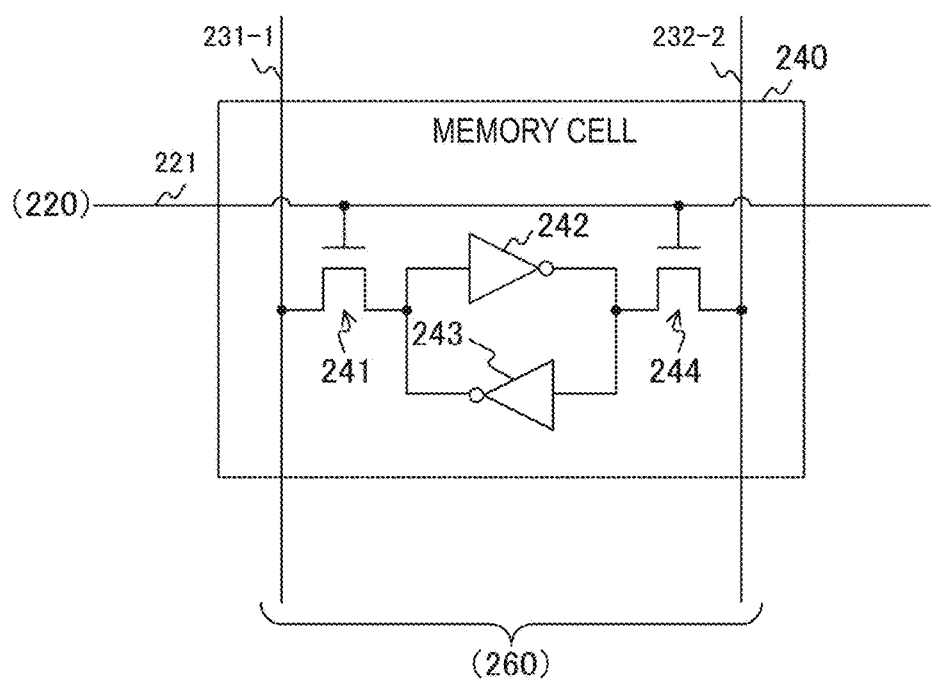
FIG. 3 is a circuit diagram illustrating a configuration example of a memory cell according to the first embodiment of the present technology.

FIG. 3 is a circuit diagram illustrating a configuration example of the memory cell 240 according to the first embodiment. The memory cell 240 includes transistors 241 and 244 and inverters 242 and 243. For example, n-type MOS transistors are used as the transistors 241 and 244.

A gate of the transistor 241 is connected to a word line (221 or the like), and a source thereof is connected to one of the pair of bit lines (231-1 or the like). In addition, a drain of the transistor 241 is connected to an input terminal of the inverter 242 and an output terminal of the inverter 243.

A gate of the transistor 244 is connected to a word line (221 or the like), and a source thereof is connected to the other of the pair of bit lines (231-2 or the like). In addition, a drain of the transistor 244 is connected to an output terminal of the inverter 242 and an input terminal of the inverter 243.

The input terminal of the inverter 242 is connected to the output terminal of the inverter 243 and the drain of the transistor 241. The input terminal of the inverter 243 is connected to the output terminal of the inverter 242 and the drain of the transistor 244. The inverters 242 and 243 connected in a ring shape in this manner function as a storage element that stores 1-bit data. Note that a circuit includes the inverters 242 and 243 is an example of the storage element described in the claims.

When written data is written in the aforementioned memory cell 240, the word control unit 220 controls a potential of a word line on a row of a writing destination such that it is brought to a high level and controls a potential of word lines on rows other than that of the writing destination such that it is brought into a low level. Note that each word line is an example of the gate signal line described in the claims, and the word control unit 220 is an example of the gate signal line potential control unit described in the claims.

In addition, the input and output control unit 300 controls one of the pair of bit lines such that it is brought to a high level and the other such that it is brought to a low level on the basis of a value of the written data. In a case in which a binary value "0" is written, for example, the input and output control unit 300 controls the bit line 23n-1 on the column of the writing destination such that it is brought to the low level and controls the bit line 23n-2 thereof such that it is brought to the high level. Meanwhile, in a case in which a binary value "1" is written, the input and output control unit 300 controls the bit line 23n-1 on the column of the writing destination such that it is brought to the high level and controls the bit line 23n-2 thereof such that it is brought to the low level. A voltage between the gate and the source of one of the transistors 241 and 244 becomes higher than a threshold voltage, and the one of the transistors is brought into the ON state, through the control. Then, 1-bit data is written in the storage element including the inverters 242 and 243. In addition, both the potentials of the bit lines 23n-1 and 23n-2 of each column other than that of the writing destination are controlled such that they are brought to the high level.

Here, if the potential of the bit line controlled such that it is brought to the low level is excessively high, there is a concern that the writing of the data in the memory cell 240 fails. In a case in which the potential of the bit line set such that it is brought to the low level is a value that is as significantly high as about −10 millivolts (mV), for example, the voltage between the gate and the source of the transistor 244 becomes less than the threshold voltage, and the transistor is not brought into the ON state. As a result, data is not written.

In addition, there is a concern that the writing of the data in the memory cell 240 also fails if the potential of the bit line controlled such that it is brought to the low level is excessively low. In a case in which the potential of the bit line set such that it is brought to the low level is a value that is as significantly low as about −600 millivolts (mV), for example, the voltage between the gate and the source of the transistor 244 becomes equal to or greater than the insulation breakdown voltage, and insulation breakdown occurs in a gate insulating film. Alternatively, there is a concern that the voltage between the gate and the source of the transistor (241 or 244) in the memory cell 240, which is not the writing destination, becomes equal to or greater than the threshold voltage and data is erroneously written in the memory cell 240, which is not the writing destination. Therefore, it is necessary to control the potential of the bit line such that the potential becomes an appropriate value.

[Configuration Example of Column Control Unit]

Figure 4:
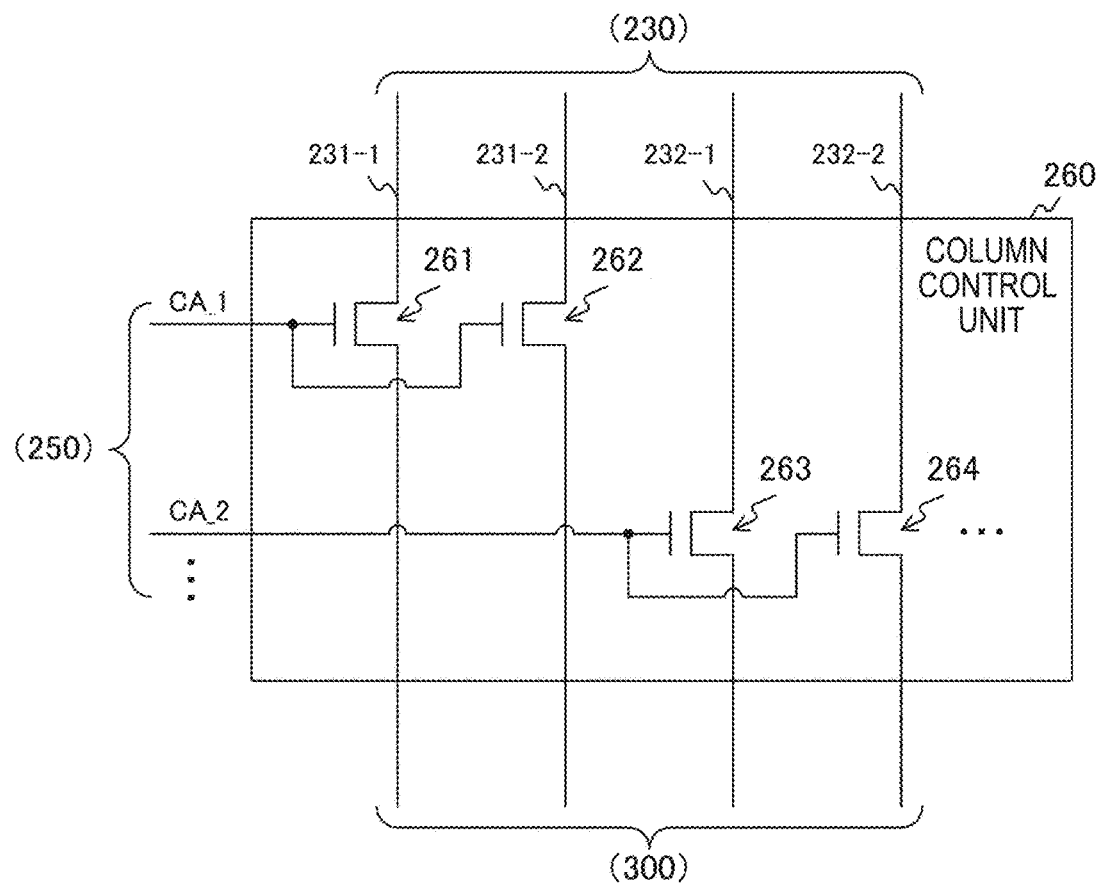
FIG. 4 is a circuit diagram illustrating a configuration example of a column control unit according to the first embodiment of the present technology.

FIG. 4 is a circuit diagram illustrating a configuration example of the column control unit 260 according to the first embodiment. The column control unit 260 includes a pair of transistors for each column. For example, transistors 261 and 262 are provided for the first column, and transistors 263 and 264 are provided for the second column. For example, n-type MOS transistors are used as these transistors.

The pair of transistors, such as transistors 261 and 262, open and close paths of the pair of bit lines 23n-1 and 23n-2 in accordance with the column address CA_n. Here, the column address CA_n indicates whether or not the n-th column is an access destination. In a case in which the column address CA_n is at the high level, for example, both the paths of the pair of bit lines on the n-th column are brought into the opened state. In a case in which the column address CA_n is at the low level, both the paths thereof are brought into the closed state. Then, the bit lines corresponding to the column address CA_n at the low level are pre-charged up to the power source potential VDD.

[Configuration Example of Input and Output Control Unit]

Figure 5:
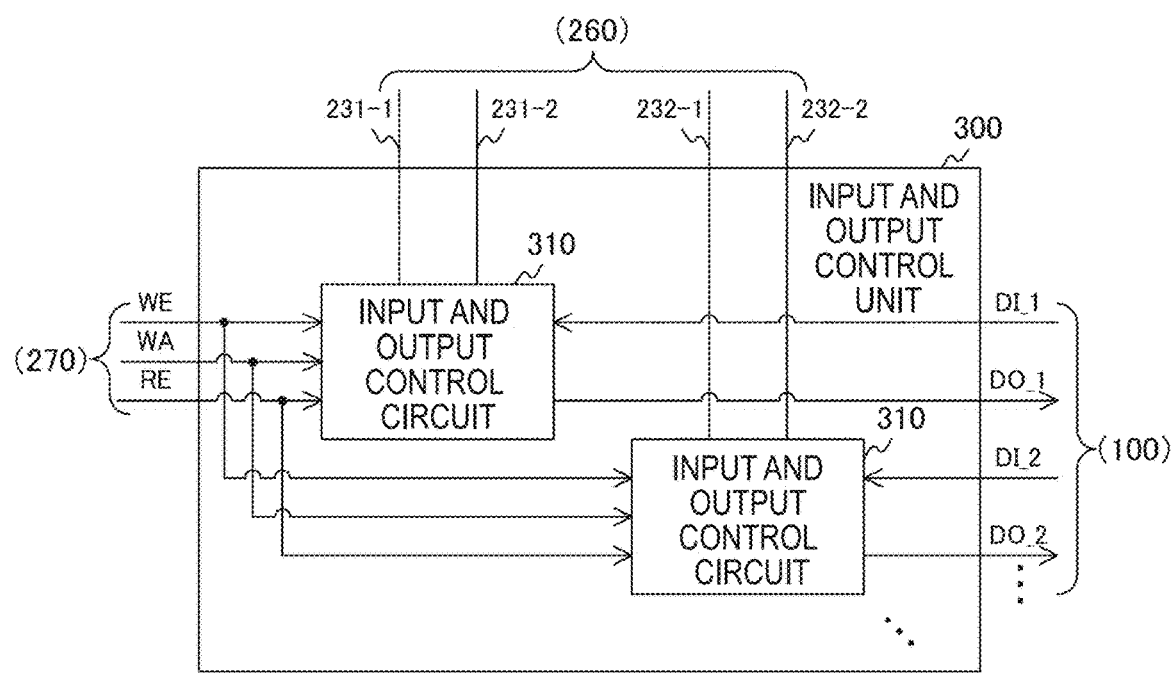
FIG. 5 is a block diagram illustrating a configuration example of an input and output control unit according to the first embodiment of the present technology.

FIG. 5 is a block diagram illustrating a configuration example of the input and output control unit 300 according to the first embodiment. The input and output control unit 300 includes an input and output control circuit 310 for each column. The input and output control circuit 310 corresponding to the n-th column is connected to the pair of bit lines 23n-1 and 23n-2. In addition, the writing enabling signal WE and the writing assist activation signal WA are input to each input and output control circuit 310 for writing, and the reading enabling signal RE is input for reading. Further, the written data DI_n and the read data DO_n are input and output to and from the input and output control circuit 310 on the n-th column. Here, the written data DI_n indicates a bit written in the n-th column in the written data DI. The read data DO_n indicates a bit read from the n-th column in the read data DO.

Figure 6:
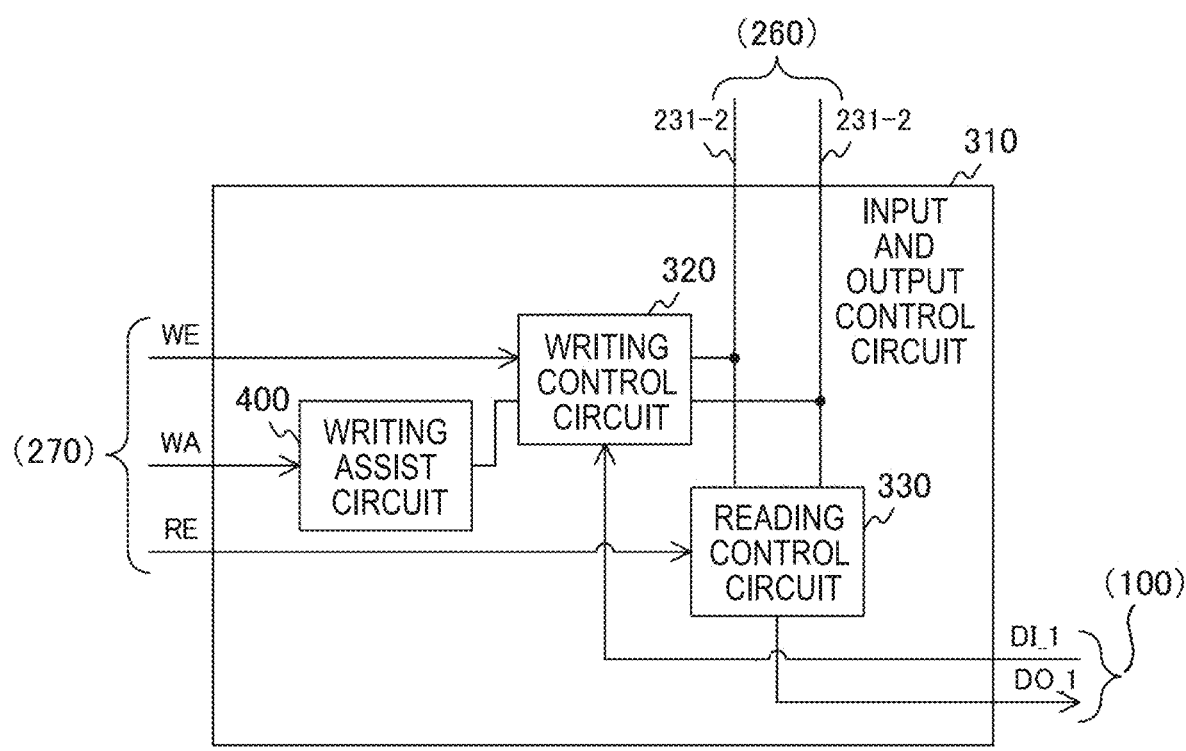
FIG. 6 is a block diagram illustrating a configuration example of an input and output control circuit according to the first embodiment of the present technology.

FIG. 6 is a block diagram illustrating a configuration example of the input and output control circuit 310 according to the first embodiment. The input and output control circuit 310 includes a writing control circuit 320, a reading control circuit 330, and a writing assist circuit 400.

The writing control circuit 320 controls potentials of the pair of bit lines 23n-1 and 23n-2 on the basis of a value of data to be written in a corresponding column. The writing control circuit 320 controls the bit line 23n-1 such that it is brought to the low level and controls the bit line 23n-2 such that it is brought to the high level in a case in which the binary value "0" is written, for example. Meanwhile, in a case in which the binary value "1" is written, the writing control circuit 320 controls the bit line 23n-1 on the corresponding column such that it is brought to the high level and controls the bit line 23-n thereof such that it is brought to the low level.

The writing assist circuit 400 causes one of the potentials of the corresponding bit lines 23-1 and 23n-2 to drop such that the one of the potentials become a lower negative potential than the reference potential VSS in response to supply of the writing assist activation signal WA.

[Configuration Example of Writing Assist Circuit]

Figure 7:
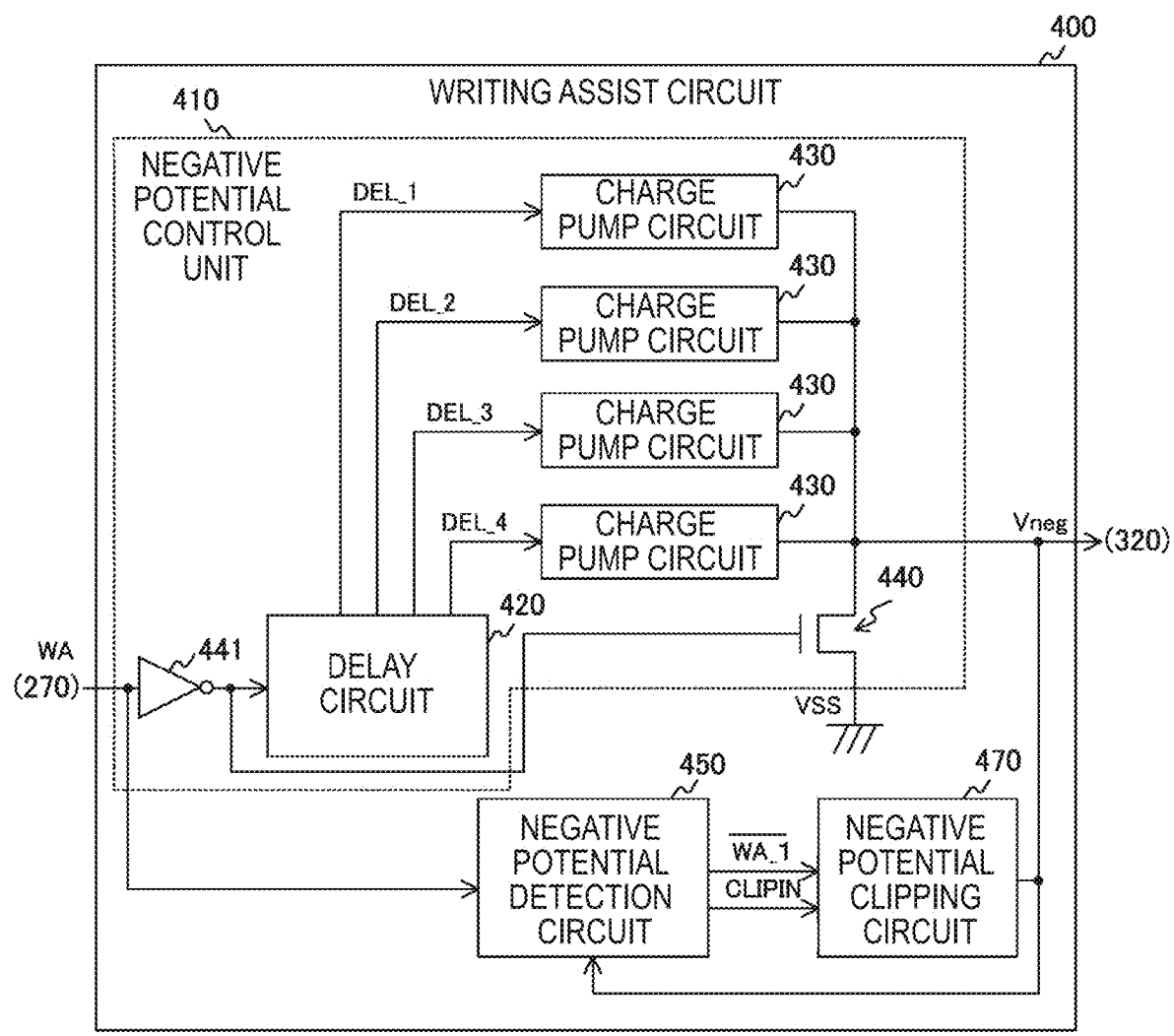
FIG. 7 is a block diagram illustrating a configuration example of a writing assist circuit according to the first embodiment of the present technology.

FIG. 7 is a block diagram illustrating a configuration example of the writing assist circuit 400 according to the first embodiment. The writing assist circuit 400 includes a negative potential control unit 410, a negative potential detection circuit 450, and a negative potential clipping circuit 470.

The negative potential control unit 410 drops the one of the potentials of the corresponding bit lines 23n-1 and 23n-2 such that the one of the potentials becomes lower than the reference potential VSS. The negative potential control unit 410 includes an inverter 441, a delay circuit 420, a plurality of charge pump circuit 430, and a transistor 440. For example, an n-type MOS transistor is used as the transistor 440. Note that the pair of bit lines are an example of the first source signal line and the second source signal line described in the claims. In addition, the negative potential control unit 410 is an example of the source signal line control unit described in the claims.

The inverter 441 inverts the writing assist activation signal WA. The inverter 441 supplies the inverted signal to the delay circuit 420 and the transistor 440. The delay circuit 420 causes the inverted signal of the writing assist activation signal WA to be delayed with a plurality of different delay times. The delay circuit 420 supplies the respective delayed signals as delay signals to the charge pump circuit 430. For example, four charge pump circuits 430 are provided, and four delay signals DEL_1, DEL_2, DEL_3, and DEL_4 with different delay times are sequentially generated. The delay signal DEL_k (k is an integer from 1 to 4) is supplied to the k-th charge pump circuit 430.

The charge pump circuit 430 controls the potential of the bit lines by using a capacitance. The charge pump circuit 430 causes the potential of the bit lines to drop such that the potential becomes lower than the reference potential VSS in response to supply of the delay signal DEL_k. Here, if the potential of the bit lines excessively approaches the VSS (in other words, the potential is excessively high), the voltage between the gate and the source of the transistor 241 or 244 becomes less than the threshold voltage, and the transistor is not brought into the ON state as described above. Since the data writing fails at this time, the four charge pump circuits 430 cause the potential of the bit line to drop up to a sufficiently low value such that the voltage between the gate and the source becomes equal to or greater than the threshold voltage. Note that the numbers of delay signals and the charge pump circuits 430 are not limited to four.

The writing assist activation signal WA is input to the gate of the transistor 440, and the drain is brought into a released state. In addition, the drain of the transistor 440 is connected to the charge pump circuit 430, the negative potential clipping circuit 470, the negative potential detection circuit 450, and the writing control circuit 320.

The negative potential detection circuit 450 detects that the potential of the bit lines has dropped and reached a specific fixed potential $V_{clip}$ when the writing assist activation signal WA is supplied. The negative potential detection circuit 450 supplies a detection signal CLIPIN indicating the result of the detection and the signal obtained by inverting the writing assist activation signal WA to the negative potential clipping circuit 470. Note that the negative potential detection circuit 450 is an example of the detection unit described in the claims.

The negative potential clipping circuit 470 fixes the potential of the bit lines at the fixed potential $V_{clip}$ in response to detecting that the potential of the bit lines has dropped up to the fixed potential $V_{clip}$. A value that is high enough not to cause a failure in writing in the memory cell 240 is set for the fixed potential $V_{clip}$. Note that the negative potential clipping circuit 470 is an example of the potential fixing unit described in the claims.

As described above, it is possible to sufficiently boost the voltage between the gate and the source of the transistor 241 or 244 in the memory cell 240 and cause the transistor 241 or 244 to reliably operate by the negative potential control unit 410 causing the potential of the bit lines to drop such that the potential becomes lower than the reference potential VSS. However, there is a concern that if the potential of the bit line excessively drops, the writing of data fails as described above. However, since the aforementioned negative potential clipping circuit 470 controls the potential of the bit lines such that the potential becomes equal to or greater than the fixed potential $V_{clip}$, it is possible to suppress the failure in data writing due to an amount of excessive drop of the potential of the bit lines.

[Configuration Example of Delay Circuit]

Figure 8:
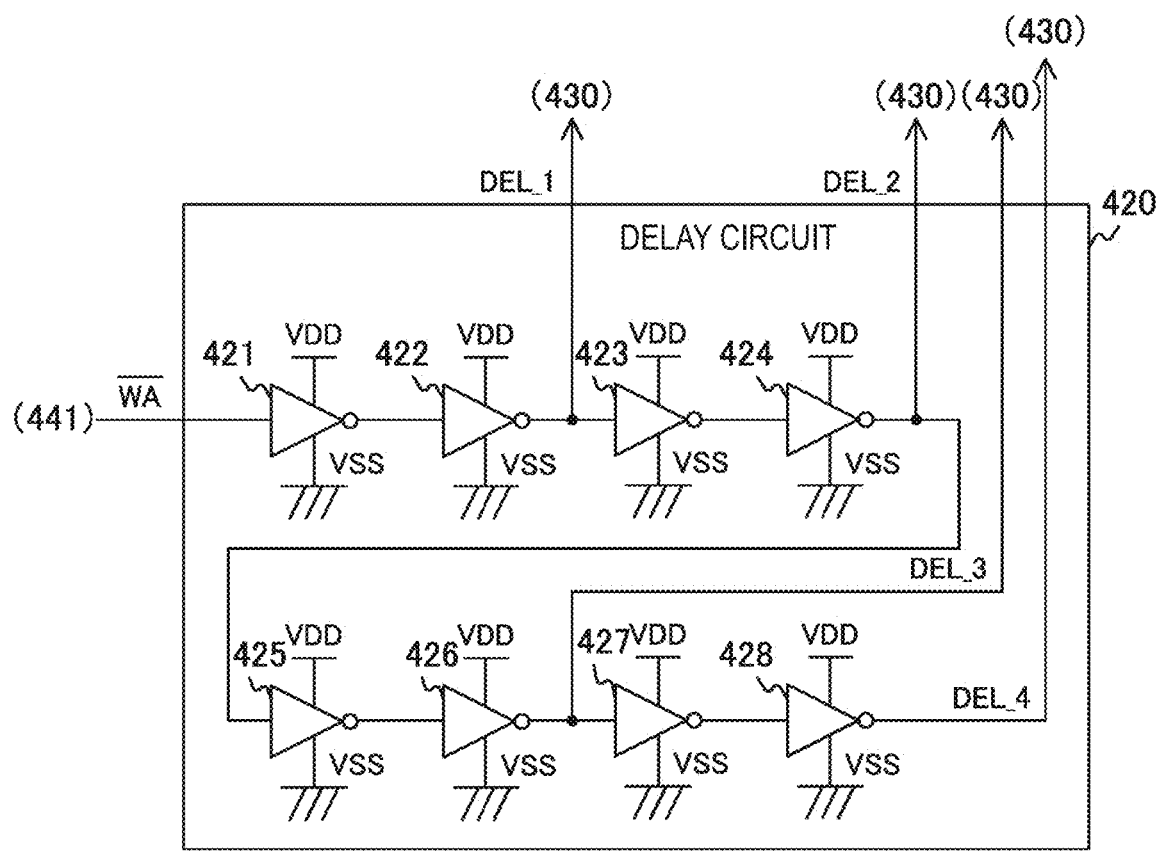
FIG. 8 is a circuit diagram illustrating a configuration example of a delay circuit according to the first embodiment of the present technology.

FIG. 8 is a circuit diagram illustrating a configuration example of the delay circuit 420 according to the first embodiment. The delay circuit 420 includes inverters 421 to 428.

The inverter 421 and the inverter 422 cause the writing assist signal WA to be delayed to obtain the delay signal DEL_1 and supply the delay signal DEL_1 to the charge pump circuit 430 ad the inverter 423 on the first stage. The inverter 423 and the inverter 424 cause the delay signal DEL_1 to be delayed to obtain the delay signal DEL_2 and supply the delay signal DEL_2 to the charge pump circuit 430 and the inverter 425 on the second stage.

The inverter 425 and the inverter 426 cause the delay signal DEL_2 to be delayed to obtain the delay signal DEL_3 and supply the delay signal DEL_3 to the charge pump circuit 430 and the inverter 427 on the third stage. The inverter 427 and the inverter 428 cause the delay signal DEL_3 to be delayed to obtain the delay signal DEL_4 and supply the delay signal DEL_4 to the charge pump circuit 430 on the fourth stage.

Note that although the inverters 421 to 428 are provided as delay elements, delay elements other than the inverters, such as buffers, may be provided instead.

[Configuration Example of Charge Pump Circuit]

Figure 9:
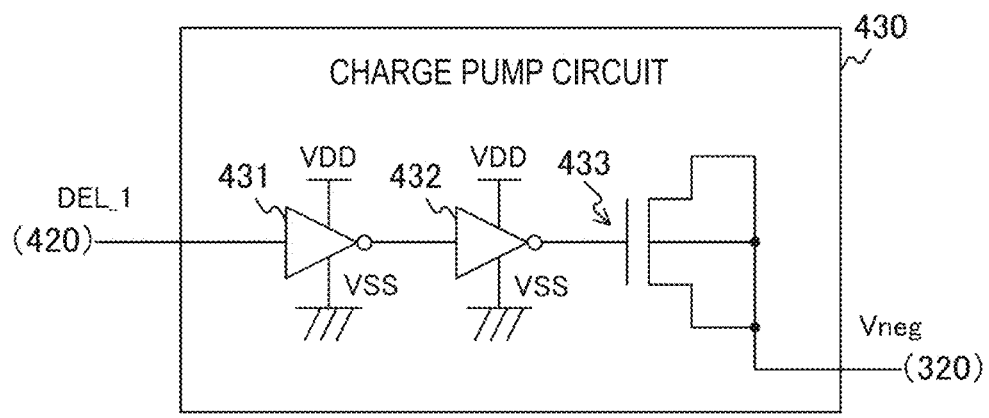
FIG. 9 is a circuit diagram illustrating a configuration example of a charge pump circuit according to the first embodiment of the present technology.

FIG. 9 is a circuit diagram illustrating a configuration example of the charge pump circuit 430 according to the first embodiment. The charge pump circuit 430 includes inverters 431 and 432 and a transistor 433. For example, an n-type MOS transistor is used as the transistor 433. The inverters 431 and 432 are inserted between the delay circuit 420 and the gate of the transistor 433 in series. The inverters 431 and 432 output the power source potential VDD or the reference potential VSS on the basis of an input signal. In addition, a back gate, a source, and a drain of the transistor 433 are connected thereto. Also, the drain of the transistor 433 is connected to the writing control circuit 320.

It is possible to connect the MOS capacitor of the transistor 433 to the bit line via the writing control circuit 320 by connecting (short-circuiting) the back gate and the drain of the transistor 433. The charge pump circuit 430 can control the potential of the bit line by charging and discharging the MOS capacitor with the power source potential VDD or the reference potential VSS. In addition, it is possible to further suppress the increase in wiring resources in the configuration in which the potential of the bit line is controlled by using the MOS capacitor than in the configuration in which a wiring layer is newly added to control the potential of the bit line by a wiring capacitance between the wiring layer and the bit line.

[Configuration Example of Negative Potential Detection Circuit]

Figure 10:
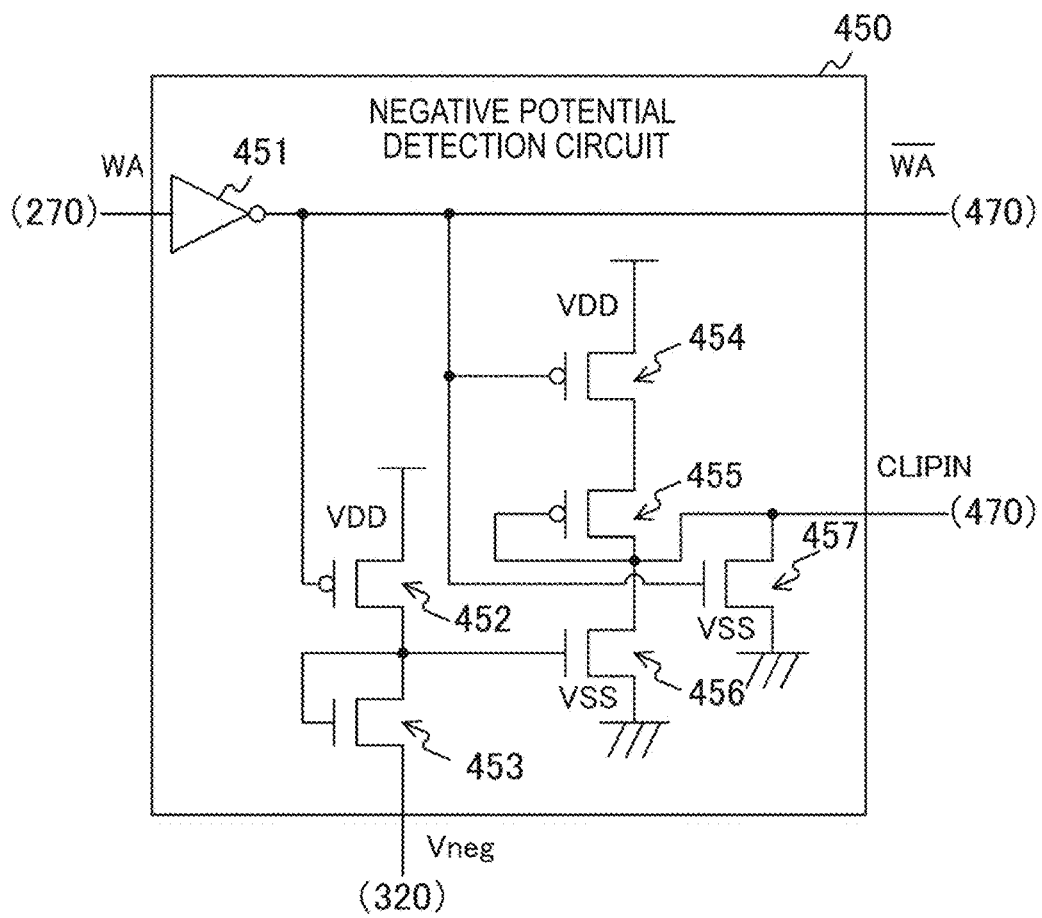
FIG. 10 is a circuit diagram illustrating a configuration example of a negative potential detection circuit according to the first embodiment of the present technology.

FIG. 10 is a circuit diagram illustrating a configuration example of the negative potential detection circuit 450 according to the first embodiment. The negative potential detection circuit 450 includes an inverter 451 and transistors 452, 453, 454, 455, 456, and 457. p-type MOS transistors are used as the transistors 452, 454, and 455. In addition, n-type MOS transistors are used as the transistors 453, 456, and 457.

The inverter 451 inverts the writing assist activation signal WA and supplies the inverted signal to gates of the transistors 452, 454, and 457 and the negative potential clipping circuit 470.

The transistors 452 and 453 are connected in series between a power source terminal of the power source potential VDD and the writing control circuit 320. In addition, a gate of the transistor 453 is connected to a connection point of the transistors 452 and 453, and the connection point is connected to a gate of the transistor 456.

The transistors 454, 455, and 456 are connected in series between the power source terminal and a ground terminal of the reference potential VSS. In addition, a gate of the transistor 455 is connected to a connection point of the transistors 455 and 456.

In addition, a drain of the transistor 457 is connected to the connection point of the transistors 455 and 456 and the negative potential clipping circuit 470, and a source thereof is connected to the ground terminal. A signal of the potential at the connection point is output as a detection signal CLIPIN.

With the aforementioned configuration, if the writing assist activation signal WA at the high level is input, then the negative potential detection circuit 450 is activated, and detection of a potential $V_{neg}$ of the bit line is started. Then, the level of the detection signal CLIPIN increases as the potential $V_{neg}$ decreases. When the potential $V_{neg}$ of the bit line has dropped up to the fixed potential $V_{clip}$, the level of the detection signal CLIPIN becomes a value that exceeds the threshold voltage of the n-type transistor in the negative potential clipping circuit 470 in the later stage.

[Configuration Example of Negative Potential Clipping Circuit]

Figure 11:
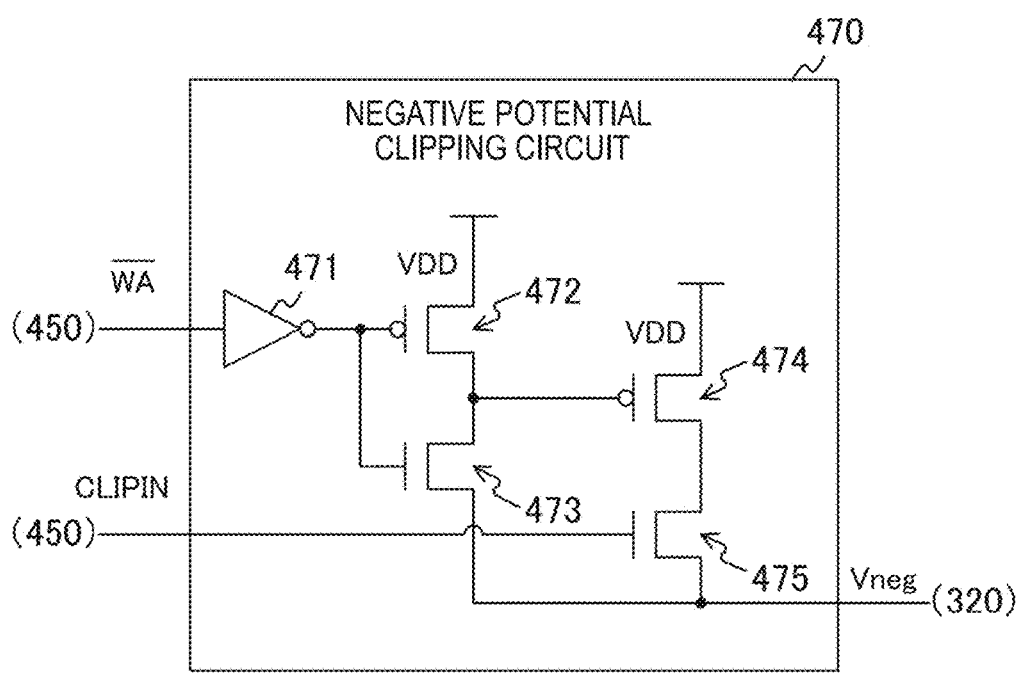
FIG. 11 is a circuit diagram illustrating a configuration example of a negative potential clipping circuit according to the first embodiment of the present technology.

FIG. 11 is a circuit diagram illustrating a configuration example of the negative potential clipping circuit 470 according to the first embodiment. The negative potential clipping circuit 470 includes an inverter 471 and transistors 472, 473, 474, and 475. p-type MOS transistors are used as the transistors 472 and 474. n-type transistors are used as the transistors 473 and 475.

The inverter 471 inverts the inverted signal of the writing assist activation signal WA and supplies the signal to the gates of the transistors 472 and 473.

The transistors 472 and 473 are connected in series between the power source terminal and the writing control circuit 320. In addition, the transistors 474 and 475 are connected in series between the power source terminal and the writing control circuit 320.

A connection point of the transistors 472 and 473 is connected to a gate of the transistor 474. Further, the detection signal CLIPIN is input to a gate to the transistor 475.

With the aforementioned configuration, if the writing assist activation signal WA at the high level is input, then the negative potential clipping circuit 470 is activated. The activated negative potential clipping circuit 470 starts to supply a current to the bit line when the level of the detection signal CLIPIN exceeds the threshold voltage of the transistor 475 (that is, when the potential $V_{neg}$ of the bit line has dropped up to the fixed potential $V_{clip}$). With the current, the potential $V_{neg}$ of the bit line increases, and in accordance with this, the level of the detection signal CLIPIN decreases.

Then, when the level of the detection signal CLIPIN becomes equal to or less than the threshold voltage of the transistor 475 (that is, when the potential $V_{neg}$ becomes higher than the fixed potential $V_{clip}$), the negative potential clipping circuit 470 stops supplying the current to the bit line. In this manner, the negative potential clipping circuit 470 can fix the potential $V_{neg}$ of the bit line at the fixed potential $V_{clip}$ since the negative potential clipping circuit 470 controls the supply of the current to the bit line in accordance with the potential $V_{neg}$ of the bit line.

[Configuration Example of Writing Control Circuit]

Figure 12:
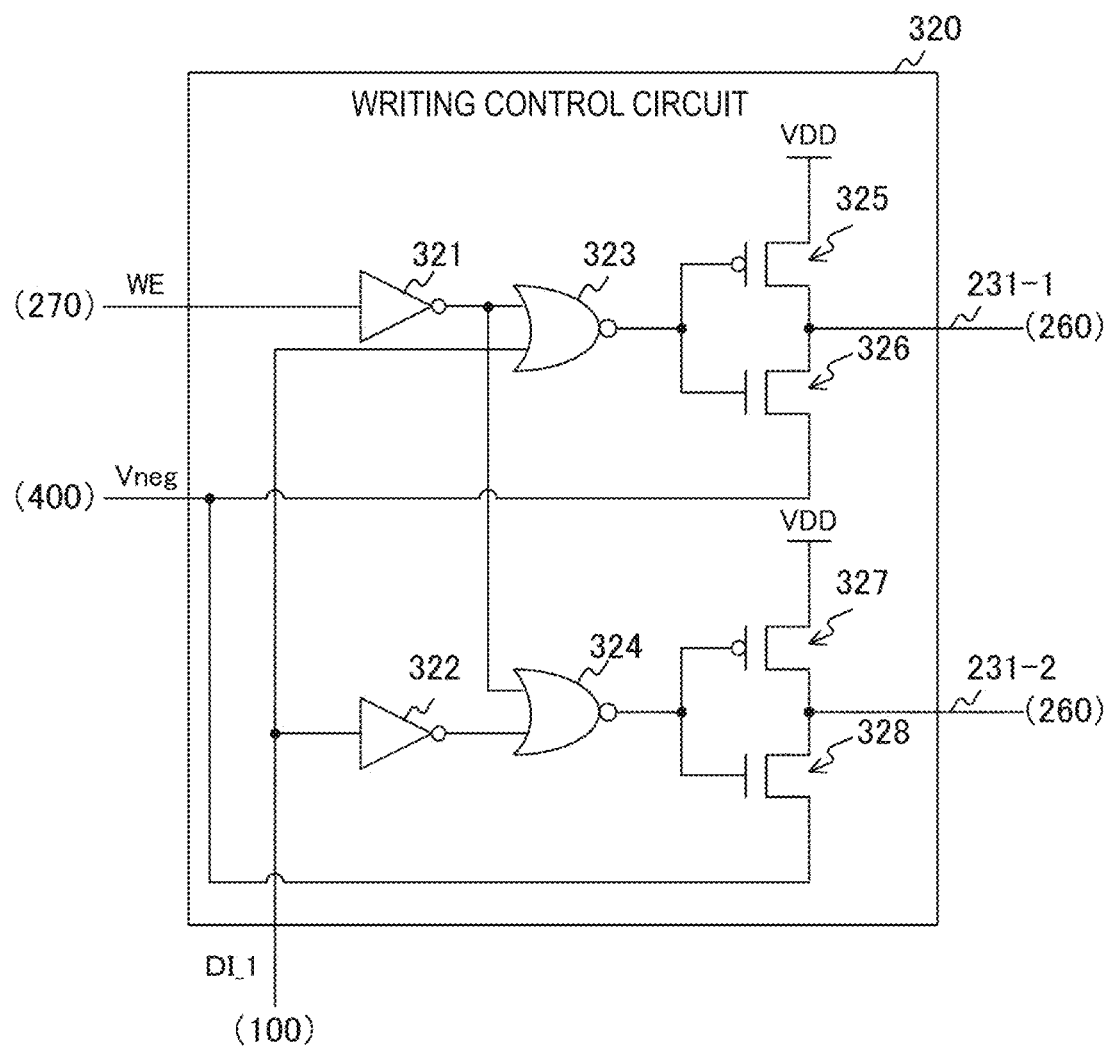
FIG. 12 is a circuit diagram illustrating a configuration example of a writing control circuit according to the first embodiment of the present technology.

FIG. 12 is a circuit diagram illustrating a configuration example of the writing control circuit 320 according to the first embodiment. The writing control circuit 320 includes inverters 321 and 322, a negative logical sum (NOR) gates 323 and 324, and transistors 325, 326, 327, and 328. p-type MOS transistors are used as the transistors 325 and 327, and n-type MOS transistors are used as the transistors 326 and 328.

The inverter 321 inverts the writing enabling signal WE and supplies the inverted signal to NOR gates 323 and 324. The inverter 322 inverts written data DI_n and supplies the inverted data to the NOR gate 324.

The NOR gate 323 supplies a negative logical sum of the inverted signal from the inverter 321 and the written data DI_n to gates of the transistors 325 and 326. The NOR gate 324 supplies a negative logical sum of the inverted signal from the inverter 321 and the inverted signal from the inverter 322 to gates of the transistors 327 and 328.

The transistors 325 and 326 are connected in series between the power source terminal and the writing assist circuit 400, and the transistors 327 and 328 are also connected in series between the power source terminal and the writing assist circuit 400. In addition, a connection point of the transistors 325 and 326 is connected to the bit line 23n-1, and a connection point of the transistors 327 and 328 is connected to the bit line 23n-2.

With the aforementioned configuration, the writing control circuit 320 controls the bit line 23n-1 such that it is brought to the high level and controls the bit line 23n-2 such that it is brought to the low level in a case in which the writing enabling signal WE is at the high level and the written data DI_n is at the high level. In addition, the writing control circuit 320 controls the bit line 23n-1 such that it is brought to the low level and controls the bit line 23n-2 such that it is brought to the high level in a case in which the writing enabling signal WE is at the high level and the written data DI_n is at the low level. In addition, the writing control circuit 320 controls both the bit lines 23n-1 and 23n-2 such that they are brought to the high level in a case in which the writing enabling signal WE is at the low level.

[Operation Example of Semiconductor Storage Device]

Figure 13:
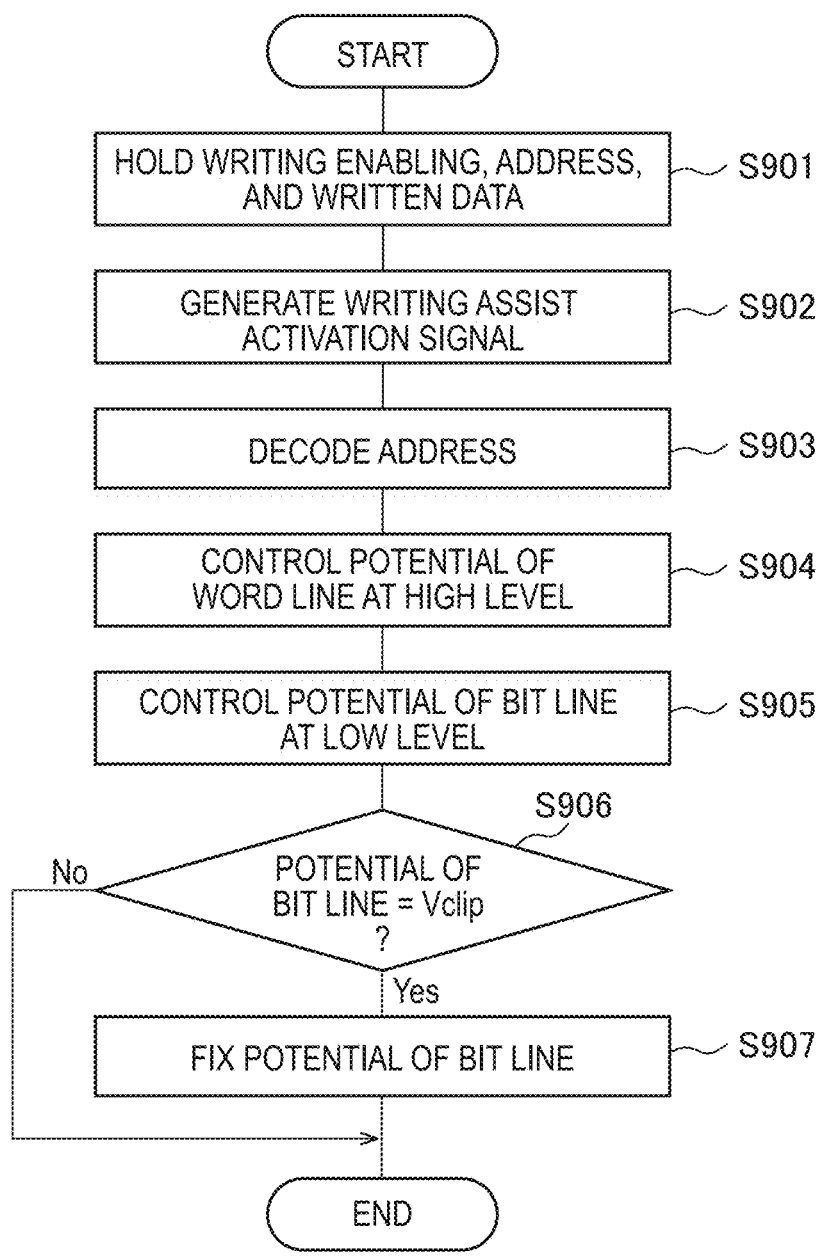
FIG. 13 is a flowchart illustrating an example of writing processing performed by the semiconductor storage device according to the first embodiment of the present technology.

FIG. 13 is a flowchart illustrating an example of writing processing performed by the semiconductor storage device 200 according to the first embodiment. The writing processing starts when the writing enabling signal WE at the high level is input, for example.

The semiconductor storage device 200 receives and holds the writing enabling signal WE, the address ADD, and the written data DI from the logic circuit 100 (Step S901). Then, the semiconductor storage device 200 generates the writing assist activation signal WA (Step S902). In addition, the semiconductor storage device 200 decodes the address ADD (Step S903), controls the potential of the word line of the access destination such that it is brought to the high level, and controls the potential of the other word lines such that it is brought to the low level, on the basis of the result of the decoding (Step S904).

In addition, the semiconductor storage device 200 controls one of the pair of bit lines on the column of the access destination such that it is brought to the low level and controls the other such that it is brought to the high level, on the basis of the result of the decoding and the written data DI_n (Step S905). Then, the semiconductor storage device 200 determines whether or not the potential of the bit line has dropped up to the fixed potential $V_{clip}$ (Step S906). In a case in which the potential has dropped up to the fixed potential Vclip (Step S906: Yes), the semiconductor storage device 200 fixes the potential of the bit line (Step S907). In a case in which the potential has not dropped up to the fixed potential Vclip (Step S906: No), or after Step S907, the semiconductor storage device 200 ends the writing processing.

Figure 14:
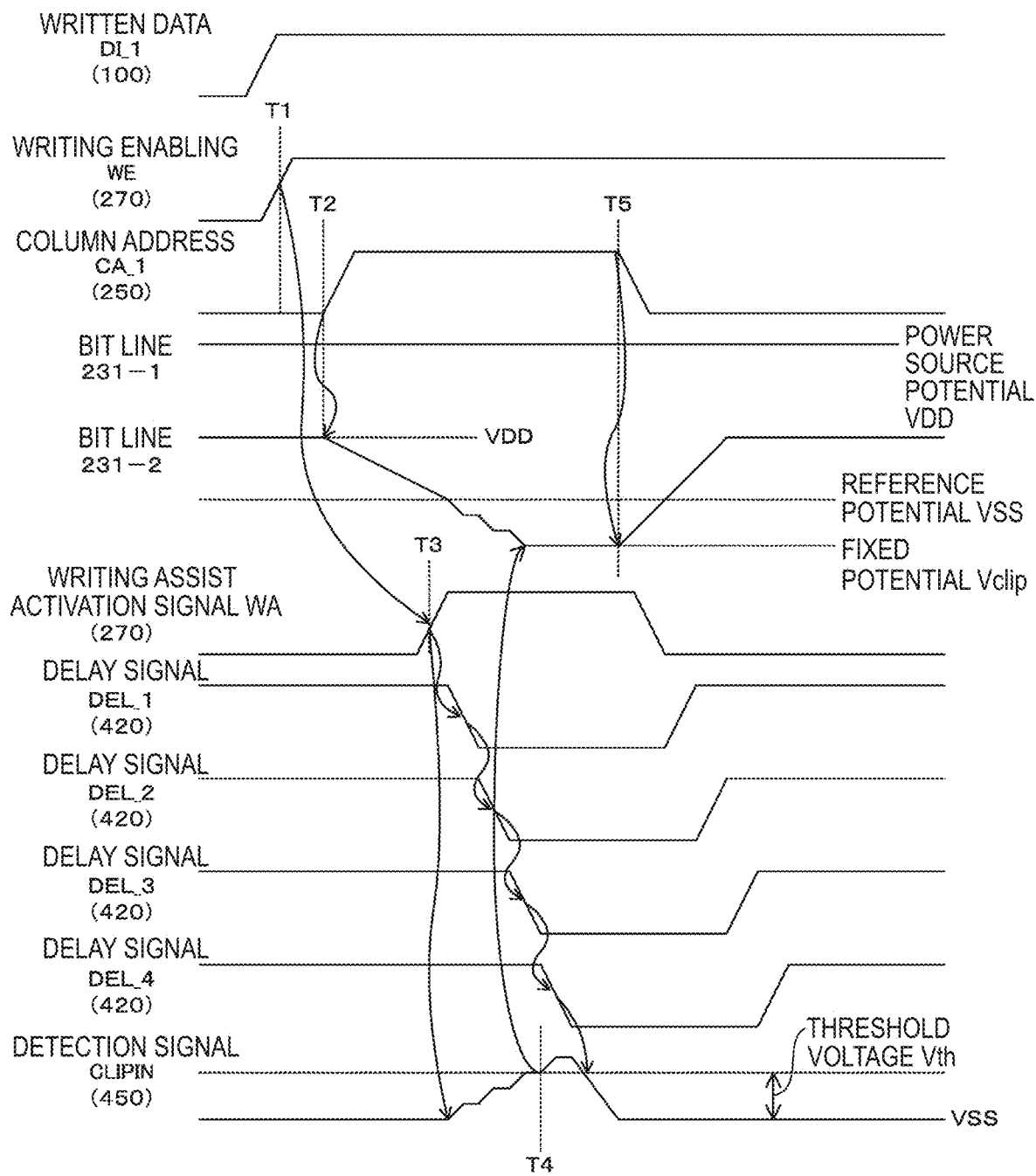
FIG. 14 is a timing chart illustrating an example of operations of the semiconductor storage device according to the first embodiment of the present technology.

FIG. 14 is a timing chart illustrating an example of operations of the semiconductor storage device 200 according to the first embodiment. When data is written, the written data DI_1, the writing enabling WE, and the address ADD are input to the semiconductor storage device 200 at a timing T1 by the logic circuit 100. The semiconductor storage device 200 decodes the address ADD and generates a column address CA_1 at the high level at a timing T2.

The word control unit 220 controls one (231-2 or the like) of the pair of bit lines 231-1 and 231-2, which has been pre-charged at the high level (power source potential VDD) by the column control unit 260, such that it is brought to the low level (reference potential VSS).

If the potential of the bit line 231-2 drops up to the reference potential VSS at a timing T3, the main control unit 270 generates the writing assist activation signal WA at the high level.

The delay circuit 420 causes the writing assist activation signal WA to be delayed to generate the delay signal DEL_1 and causes the delay signal DEL_1 to be delayed to generate the delay signal DEL_2. Similarly, the delay signal DEL_3 and the delay signal DEL_4 are sequentially generated.

In accordance with these delay signals, the four charge pump circuits 430 are sequentially activated, and the potential of the bit line 231-2 is caused to drop in a stepwise manner. In accordance with the drop of the potential, the negative potential detection circuit 450 causes the detection signal CLIPIN to increase in a stepwise manner. It is assumed that a voltage between the potential of the detection signal CLIPIN and the reference potential VSS exceeds the threshold voltage $V_{th}$ of the transistor in the negative potential clipping circuit 470 at a timing T4. At this time, the negative potential clipping circuit 470 is activated, and the dropping of the potential $V_{neg}$ of the bit line 231-2 is stopped. The activated negative potential clipping circuit 470 dynamically supplies a current to the bit line and suppresses the dropping of the potential in accordance with the dropping of the potential $V_{neg}$ of the bit line 231-2 due to the charge pump circuit 430. Therefore, $V_{neg}$ does not further drop even if the charge pump circuit 430 is activated at or after the timing T4.

Then, the negative potential detection circuit 450 and the negative potential clipping circuit 470 stop after the activation of the final charge pump circuit 430. At this time, the supply of the current from the negative potential clipping circuit 470 to the bit line 231-2 also stops, and the potential $V_{neg}$ of the bit line 231-2 remains at the fixed potential $V_{clip}$. In this manner, the potential $V_{neg}$ of the bit line 231-2 is fixed to the fixed potential $V_{clip}$. In this manner, it is possible to suppress the failure in data writing due to the amount of excessive drop of the potential $V_{neg}$ of the bit line 231-2.

If the data writing ends, the column address CA_1 is controlled such that it is brought to the low level at a timing T5, and at the same time, the writing assist circuit 400 is shifted to a state before the start of the writing. Both the bit lines 231-1 and 231-2 are pre-charged at the high level (power source potential VDD).

Figure 15:
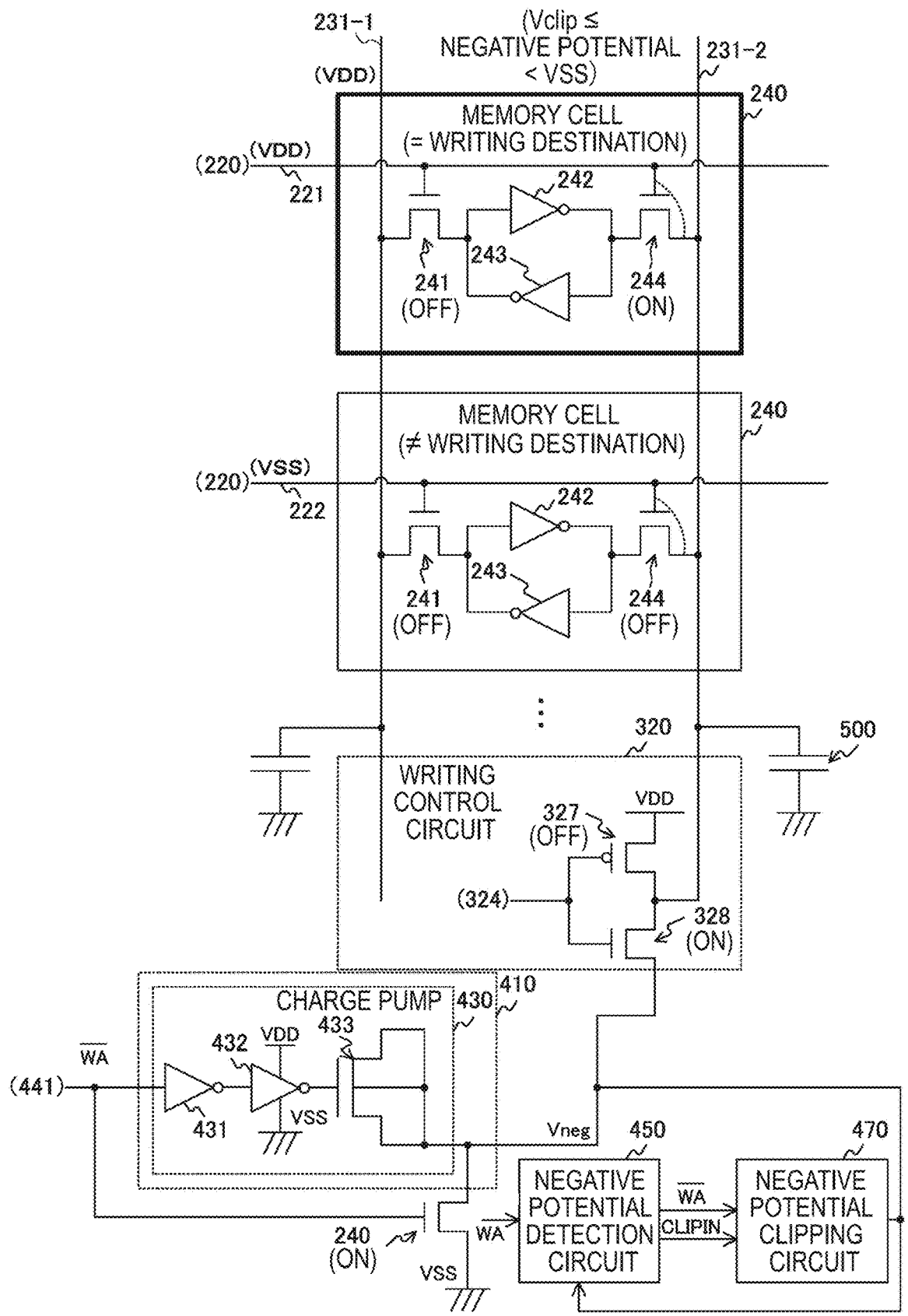
FIG. 15 is an explanatory diagram of variation in a potential of a bit line according to the first embodiment of the present technology.

FIG. 15 is an explanatory diagram of variations in potential of the bit line according to the first embodiment. A value $C_{bl}$ of the bit line capacitance 500 of the bit line 231-2 is decided in accordance with the number of word lines. During the writing operation, the input and output control unit 300 causes the potential of any (for example, 231-2) of the bit lines 231-1 and 231-2, which has been pre-charged at the power source voltage VDD, to drop up to the reference potential VSS.

Then, if the writing assist activation signal WA is input, the input and output control unit 300 causes the potential of the bit line 231-2 to drop to a lower value. At this time, the output of the inverter 432, which is a delay element in the charge pump circuit 430, shifts from the power source potential VDD to the reference potential VSS. The potential $V_{neg}$ of the bit line 231-2 can be represented by the following equation using a potential difference Vdd therebetween, a value Cc of the MOS capacitor of the transistor 433 connected to the bit line, and the value $C_{bl}$ of the bit line capacitance 500.

$$V_{neg} = Cc \times Vdd/(C_{bl} + Cc)$$

Since $C_{bl}$ becomes smaller if the number of word lines becomes excessively small, an absolute value of the potential $V_{neg}$ of the bit line unfavorably becomes a large value unless Cc is not set to be smaller than that in the aforementioned equation. In other words, the potential $V_{neg}$ excessively drops. Here, a configuration in which a wiring capacitance is used instead of the MOS capacitor is considered as a method of changing Cc in accordance with the change in $C_{bl}$. It is possible to suppress the variations in $V_{neg}$ by causing the wiring capacitance to change in accordance with the change in the number of word lines. However, since it is necessary to provide an additional wiring layer in which a dedicated wiring used for the wiring capacitance is provided in such a configuration, the wiring resources increase, and it becomes difficult to manufacture the semiconductor storage device.

Meanwhile, the charge pump circuit 430 can suppress the increase in wiring resources since the wiring capacitance is not used. Although variations in potential $V_{neg}$ of the bit line occurs instead, the potential $V_{neg}$ does not excessively drop since the potential is restricted such that the potential becomes equal to or greater than the fixed potential $V_{clip}$ by the negative potential clipping circuit 470. In this manner, it is possible to realize the semiconductor storage device 200 that exhibits high robustness against the variations in the number of word lines and the power source potential VDD (in other words, that is hardly affected by these variations) by the writing assist circuit 400.

Figure 16:
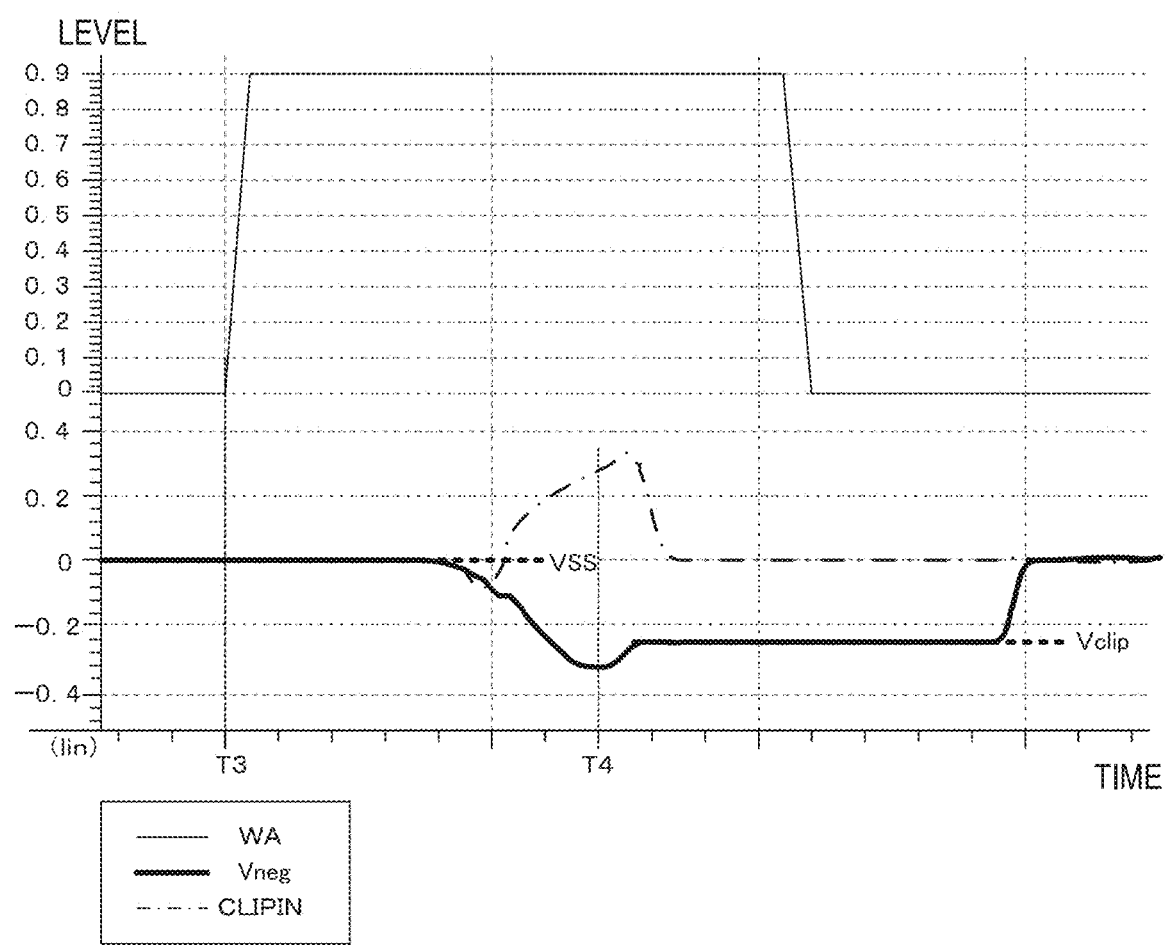
FIG. 16 is an enlarged view of a timing chart illustrating an example of operations of the semiconductor storage device according to the first embodiment of the present technology.

FIG. 16 is an enlarged view of a timing chart illustrating an example of operations of the semiconductor storage device 200 according to the first embodiment. At the timing T3, the writing assist activation signal WA at the high level is generated by the main control unit 270. In accordance with the writing assist activation signal WA, the charge pump circuit 430 causes the potential $V_{neg}$ of the bit line to drop in a stepwise manner. In accordance with the dropping of the potential, the negative potential detection circuit 450 causes the detection signal CLIPIN to increase in a stepwise manner. Then, at the timing T4, the negative potential clipping circuit 470 fixes the detection signal CLIPIN at a value that substantially coincides with the potential $V_{neg}$ of the bit line 231-2.

Figure 17:
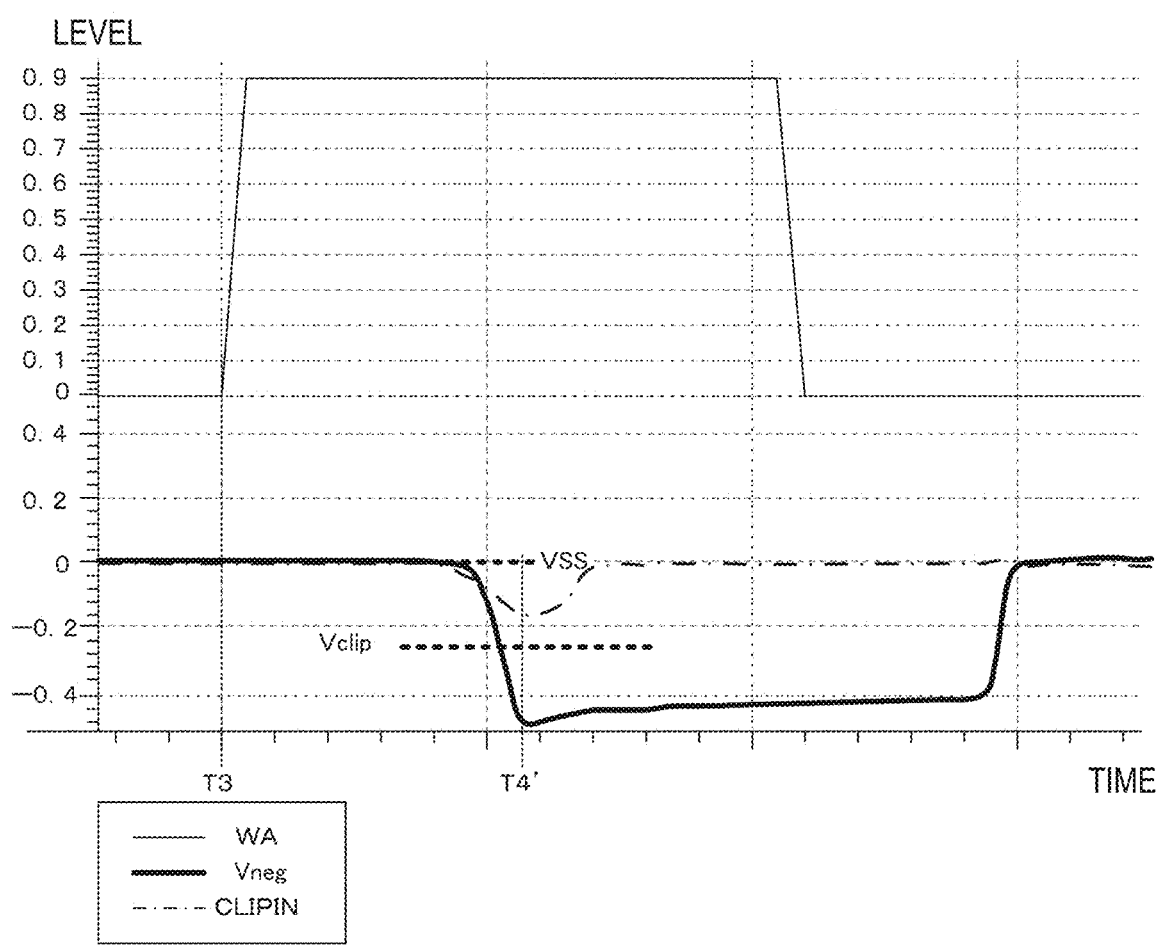
FIG. 17 is a timing chart illustrating an example of operations of a semiconductor storage device according to a comparative example.

FIG. 17 is a timing chart illustrating an example of operations of a semiconductor storage device according to a comparative example. In the comparative example, the delay circuit 420 is not provided, and it is assumed that the writing assist activation signal WA is input directly to the four charge pump circuits 430. At a timing T4' after the timing T3 at which the writing assist activation signal WA at the high level is generated, the charge pump circuit 430 causes the potential $V_{neg}$ of the bit line to instantaneously drop.

Here, a response time until the negative potential detection circuit 450 starts to increase the detection signal CLIPIN in response to the dropping of the potential $V_{neg}$ of the bit line depends on the circuit configuration of the negative potential detection circuit 450. In a case in which the potential $V_{neg}$ of the bit line is caused to instantaneously drop as illustrated in FIG. 17, there is a concern that the potential $V_{neg}$ of the bit line becomes lower than the fixed potential $V_{clip}$ before the response time elapses. In this case, the detection of the negative potential detection circuit 450 cannot be performed in time, and the detection signal CLIPIN does not increase. Therefore, the negative potential clipping circuit 470 cannot fix the potential of the bit line at an appropriate value ($V_{clip}$). Therefore, it is desirable to provide the delay circuit 420 and to cause the potential $V_{neg}$ of the bit line to drop in a stepwise manner.

Figure 18:
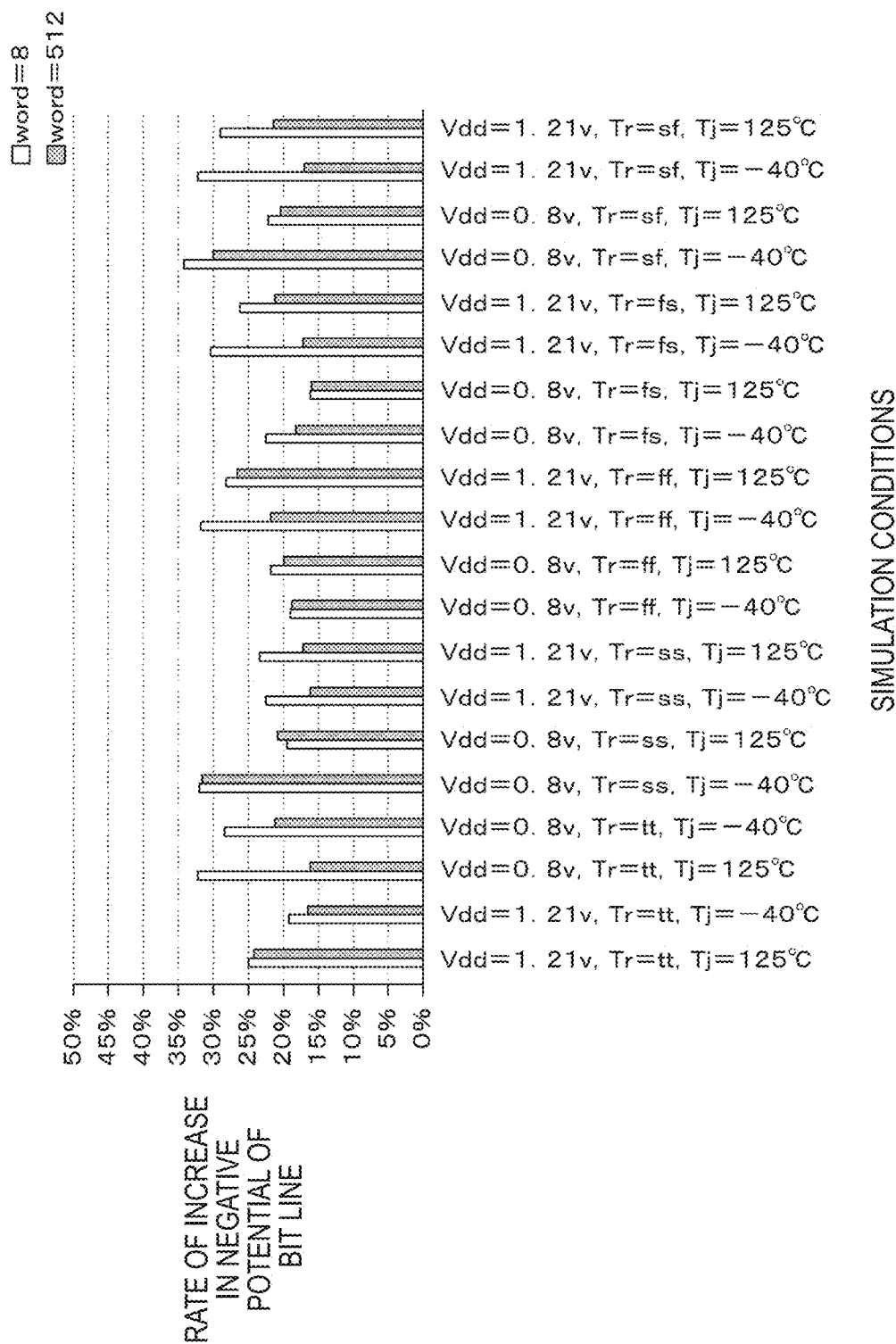
FIG. 18 is a graph illustrating an example of results of simulating a rate of increase in a negative potential of the bit line using the negative potential detection circuit and the negative potential clipping circuit according to the first embodiment of the present technology.

FIG. 18 is a graph illustrating an example of results of simulating a rate of increase in a negative potential of the bit line in a case in which the negative potential detection circuit 450 and the negative potential clipping circuit 470 are deactivated according to the first embodiment. The vertical axis represents a rate of increase in the negative potential of the bit line, and the horizontal axis represents simulation conditions in the drawing. The outlined white bar represents a rate of increase in the absolute value of the negative potential in a device in which the number of word lines is eight, and the gray bar represents a rate of increase in the negative potential in a device in which the number of word lines is 256. In a case in which the negative potential detection circuit 450 and the negative potential clipping circuit 470 are not caused to operate under the respective simulation conditions as exemplified in the drawing, the absolute value of the negative potential of the bit line increases as compared with that in the case in which the negative potential detection circuit 450 and the negative potential clipping circuit 470 are caused to operate.

According to the first embodiment of the present disclosure, the semiconductor storage device 200

2. Second Embodiment

In the aforementioned first embodiment, all the four charge pump circuits 430 are caused to constantly operate to cause the potential of the bit line to drop. However, there is also a case in which a part of the plurality of charge pumps 430 may be stopped. In a case in which the power source potential VDD is relatively high, for example, it is possible to secure the amount of decrease in the potential to such an extent that the data writing does not fail even if a part of the charge pump circuits 430 is stopped. A semiconductor storage device 200 according to a second embodiment is different from that according to the first embodiment in that the number of charge pump circuits 430 to be operated is controlled.

Figure 19:
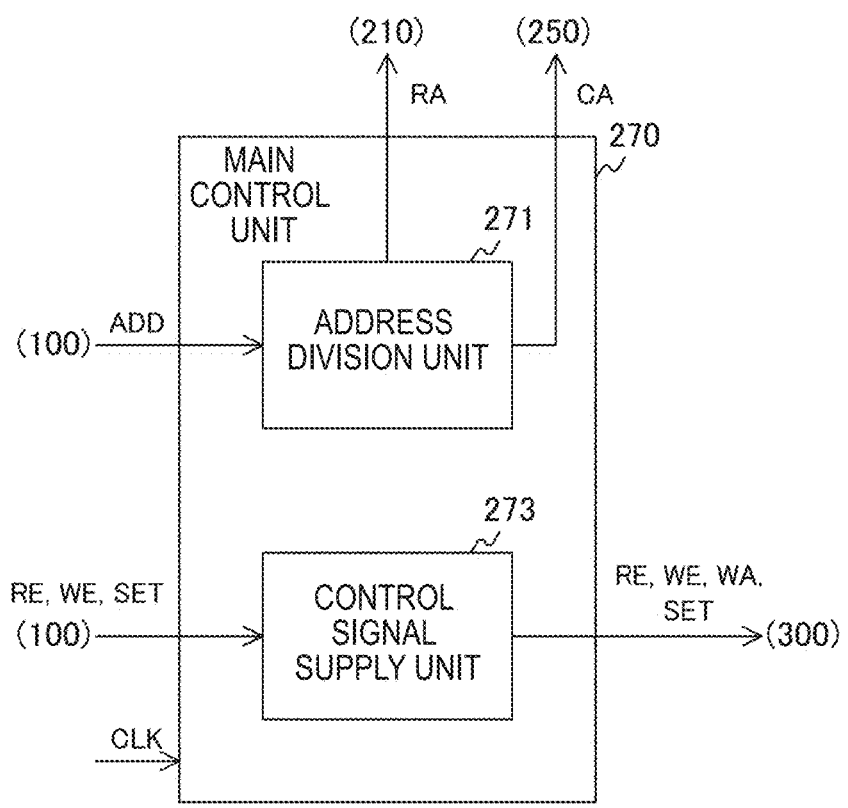
FIG. 19 is a block diagram illustrating a configuration example of a main control unit according to a second embodiment of the present technology.

FIG. 19 is a block diagram illustrating a configuration example of a main control unit 270 according to the second embodiment. The main control unit 270 according to the second embodiment is different from that according to the first embodiment in that the main control unit 270 includes a control signal supply unit 273 instead of the control signal supply unit 272.

A reading enabling signal RE, a writing enabling signal WE, and a charge pump enabling signal SET are input to the control signal supply unit 273. The charge pump enabling signal SET is a signal indicating whether or not each of the plurality of charge pump circuits 430 is to be enabled. A logic circuit 100 increases the number of the charge pump circuits 430 to be enabled as the power source voltage VDD is lower, for example, by using the charge pump enabling signal SET.

In a case in which the number of charge pump circuits 430 is four, for example, a 4-bit charge pump enabling signal SET is generated. The k-th (k is an integer from 1 to 4) bit is set at the high level in a case in which k-th charge pump circuit 430 is to be enabled, and is set at the low level in a case in which the k-th charge pump circuit 430 is deactivated. The control signal supply unit 273 supplies the charge pump enabling signal SET to the input and output control unit 300.

Figure 20:
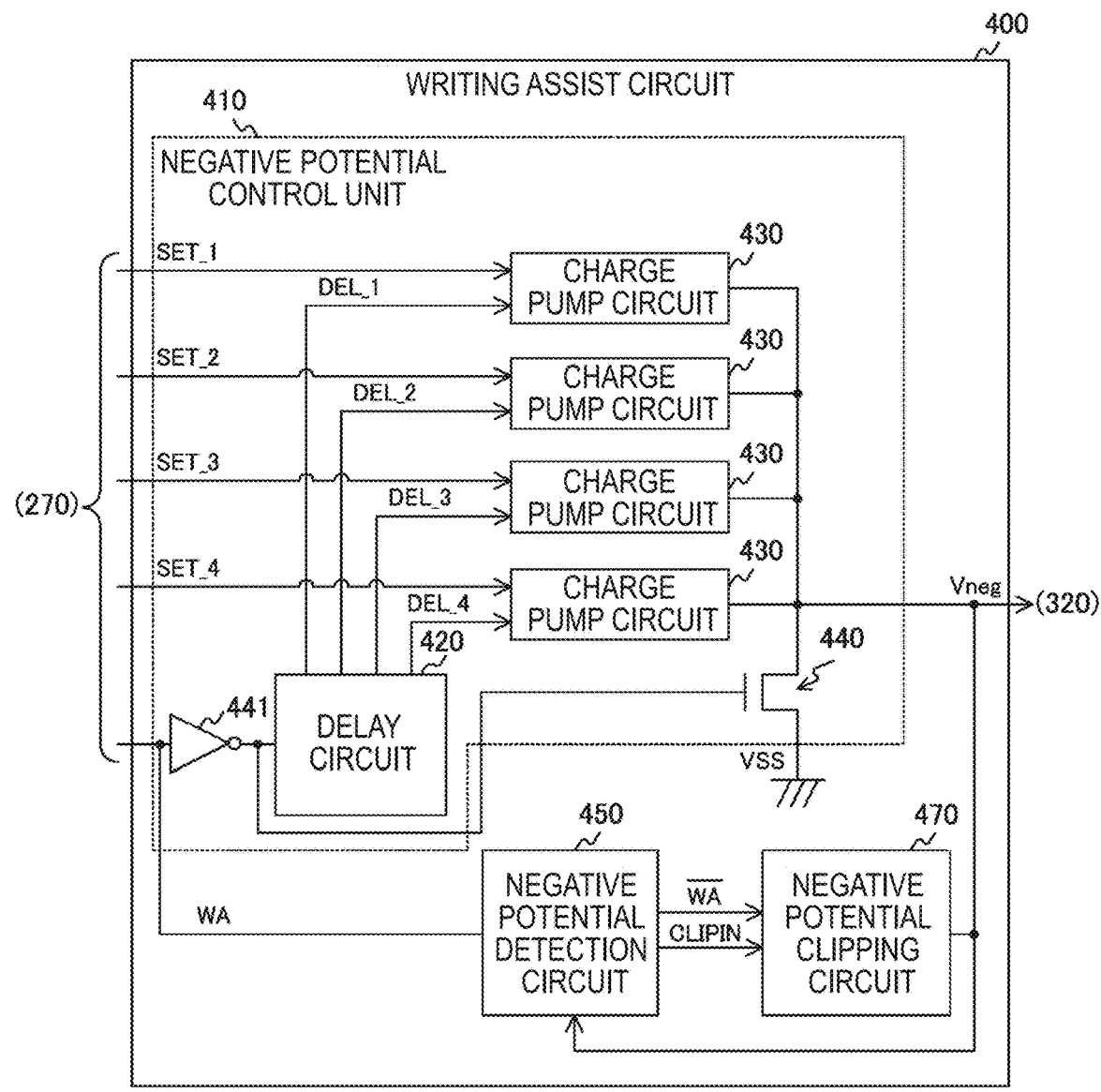
FIG. 20 is a block diagram illustrating a configuration example of a writing assist circuit according to the second embodiment of the present technology.

FIG. 20 is a block diagram illustrating a configuration example of a writing assist circuit 400 according to the second embodiment. The writing assist circuit 400 according to the second embodiment is different from that according to the first embodiment in that k-th bit SET_k from among the charge pump enabling signals SET is further input to the k-th charge pump circuit 430.

Figure 21:
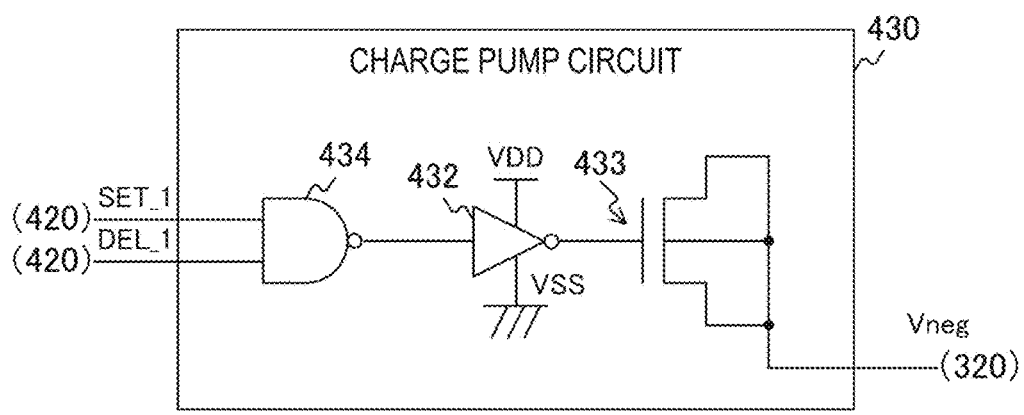
FIG. 21 is a circuit diagram illustrating a configuration example of a charge pump circuit according to the second embodiment of the present technology.

FIG. 21 is a circuit diagram illustrating a configuration example of a charge pump circuit 430 according to the second embodiment. The charge pump circuit 430 according to the second embodiment is different from that according to the first embodiment in that the charge pump circuit 430 includes a non-conjunction (NAND) gate 434 instead of the inverter 431.

The NAND gate 434 outputs non-conjunction of bit data SET_k and a delay signal DEL_k to the inverter 432.

With the aforementioned configuration, the charge pump circuit 430 operates to cause the potential of the bit line to drop in a case in which the bit data SET_k is at the high level (that is, enabled). Meanwhile, in a case in which the bit data SET_k is at the low level (that is, deactivated), the charge pump circuit 430 stops. It is possible to reduce the power consumption of the semiconductor storage device 200 by causing unnecessary charge pump circuits 430 to stop in accordance with the power source voltage VDD in this manner.

According to the second embodiment of the present technology, the semiconductor storage device 200 can reduce the power consumption by stopping the unnecessary charge pump circuit 430 since the semiconductor storage device 200 causes the plurality of charge pump circuits 430 to individually operate or stop in accordance with the enabling signal as described above.

3. Third Embodiment

Although it is not possible to change the fixed potential $V_{clip}$ in the aforementioned first embodiment, there is also a case in which it is necessary to change the fixed potential $V_{clip}$. In a case in which the power source potential VDD has dropped, for example, it is necessary to cause the fixed potential $V_{clip}$ to drop in accordance with the amount of dropping. In addition, it is necessary to increase the fixed potential $V_{clip}$ as the insulation breakdown voltage of the transistor in the memory cell is lower. A semiconductor storage device 200 according to a third embodiment is different from that according to the first embodiment in that the fixed potential $V_{clip}$ is adjusted in accordance with a control signal from a logic circuit 100.

Figure 22:
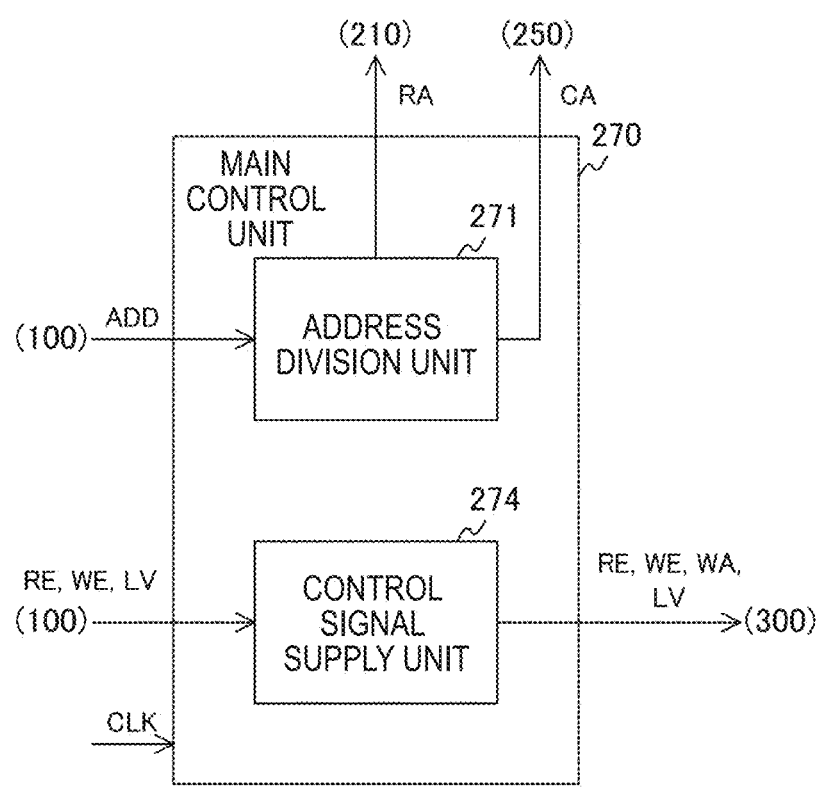
FIG. 22 is a block diagram illustrating a configuration example of a main control unit according to a third embodiment of the present technology.

FIG. 22 is a block diagram illustrating a configuration example of a main control unit 270 according to the third embodiment. The main control unit 270 according to the third embodiment is different from that according to the first embodiment in that the main control unit 270 includes a control signal supply unit 274 instead of the control signal supply unit 272. p A reading enabling signal RE, a writing enabling signal WE, and an adjustment signal LV are input to the control signal supply unit 274. The adjustment signal LV indicates an adjusted value of the fixed potential $V_{clip}$. For example, the adjustment signal LV is a signal of a plurality of bits, among which at least one bit is set to "0". The control signal supply unit 274 supplies the adjustment signal LV to the input and output control unit 300.

Figure 23:
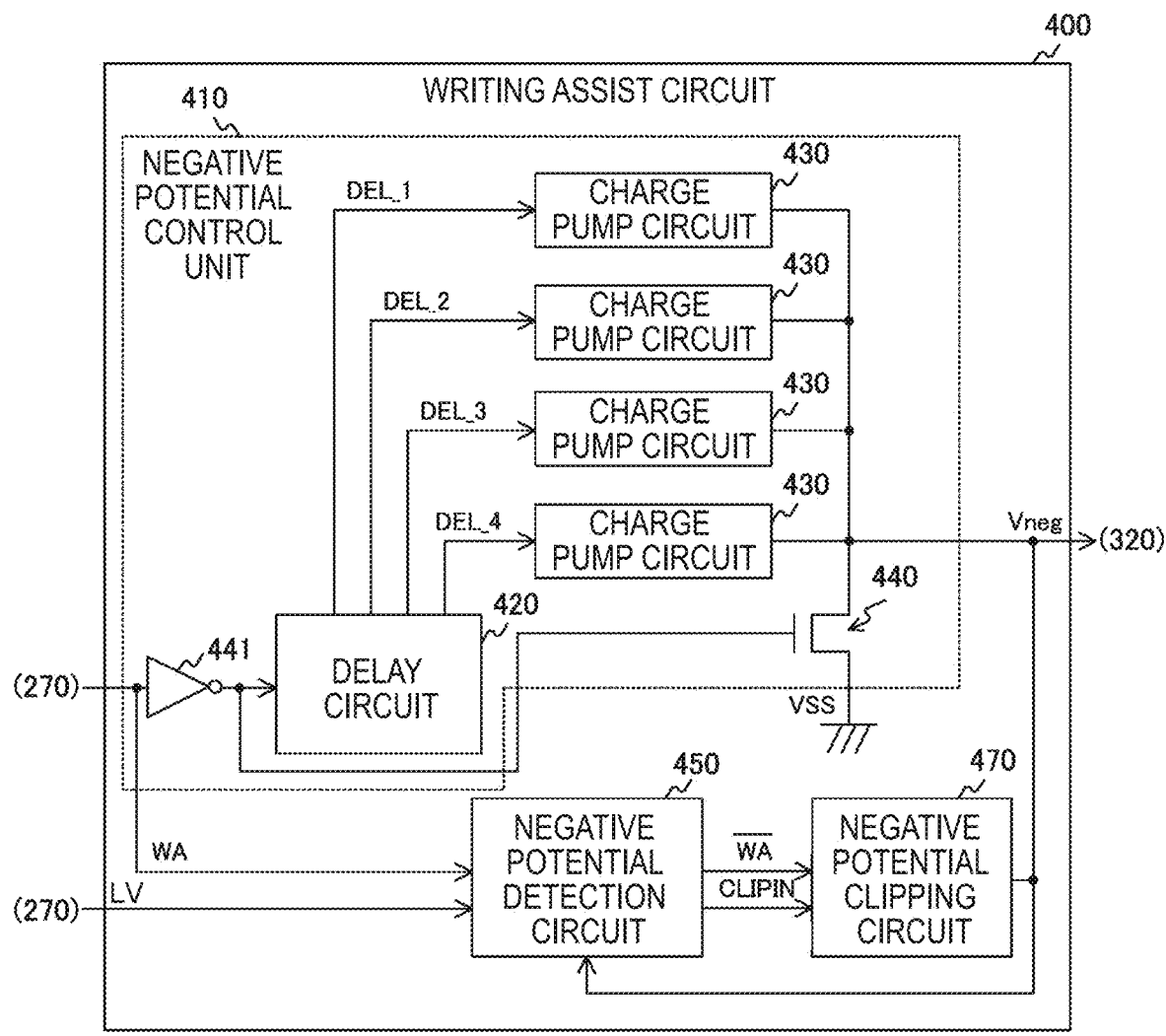
FIG. 23 is a block diagram illustrating a configuration example of a writing assist circuit according to the third embodiment of the present technology.

FIG. 23 is a block diagram illustrating a configuration example of a writing assist circuit 400 according to the third embodiment. The writing assist circuit 400 according to the third embodiment is different from that according to the first embodiment in that the adjustment signal LV is further input to the negative potential detection circuit 450.

Figure 24:
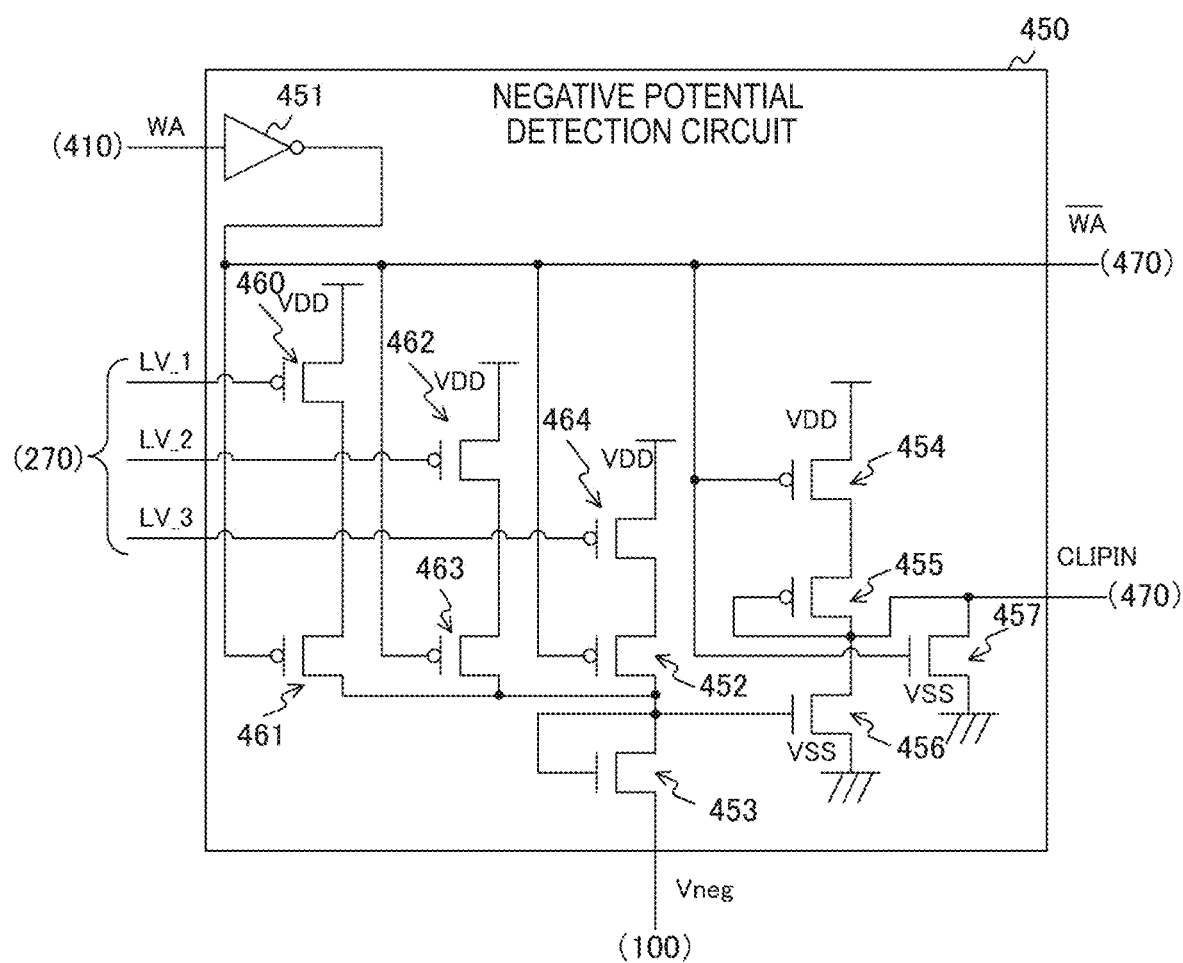
FIG. 24 is a circuit diagram illustrating a configuration example of a negative potential detection circuit according to the third embodiment of the present technology.

FIG. 24 is a circuit diagram illustrating a configuration example of the negative potential detection circuit 450 according to the third embodiment. The negative potential detection circuit 450 according to the third embodiment is different from that according to the first embodiment in that the negative potential detection circuit 450 further includes transistors 460, 461, 462, 463, and 464. p-type MOS transistors are used as the transistors. In addition, the respective sizes (gate widths and gate lengths) of the transistors 460, 462, and 464 are assumed to be different from each other.

The transistors 460 and 461 are connected in series between a power source terminal and a connection point between the transistors 464 and 452. The transistors 462 and 463 are also connected in series between the power source terminal and the connection point between the transistors 464 and 462. The transistors 464 and 452 are connected in series between the power source terminal and the transistor 453.

In addition, the first bit LV_1 of the adjustment signal LV is input to a gate of the transistor 460. The second bit LV_2 of the adjustment signal LV is input to a gate of the transistor 462, and the third bit LV_3 of the adjustment signal LV is input to a gate of the transistor 464. Then, gates of the transistors 461 and 463 are connected to an output terminal of the inverter 451.

Since the transistors 460, 462, and 464 have respectively different sizes, it is possible to change the transistors in the ON state and to adjust the level of the fixed potential $V_{clip}$ by changing the positions and the number of bits "0" in the adjustment signal LV.

Note that although the semiconductor storage device 200 adjusts the level of the fixed potential $V_{clip}$ by the 3-bit adjustment signal LV, an adjustment signal LV of equal to or less than 2 bits or equal to or greater than 4 bits may be used. In such a case, p-type MOS transistors may be reduced from or added to the negative potential detection circuit 450 in accordance with the number of bits.

According to the third embodiment of the present technology, the semiconductor storage device 200 can fix the potential of the bit line at an appropriate potential since the semiconductor storage device 200 adjusts the level of the fixed potential $V_{clip}$ in accordance with the adjustment signal.

4. Fourth Embodiment

Although the detection and the fixation of the potential of the bit line are performed by causing the negative potential detection circuit 450 and the negative potential clipping circuit 470 to constantly operate in the aforementioned first embodiment, there is a case in which the detection and the fixation are not necessarily needed. In a case in which the power source potential VDD is sufficiently low, for example, there is a less need to detect the potential of the bit line since there is no concern that the potential of the bit line excessively decreases. A semiconductor storage device 200 according to a fourth embodiment is different from that according to the first embodiment in that the negative potential detection circuit 450 and the negative potential clipping circuit 470 are caused to stop as needed.

Figure 25:
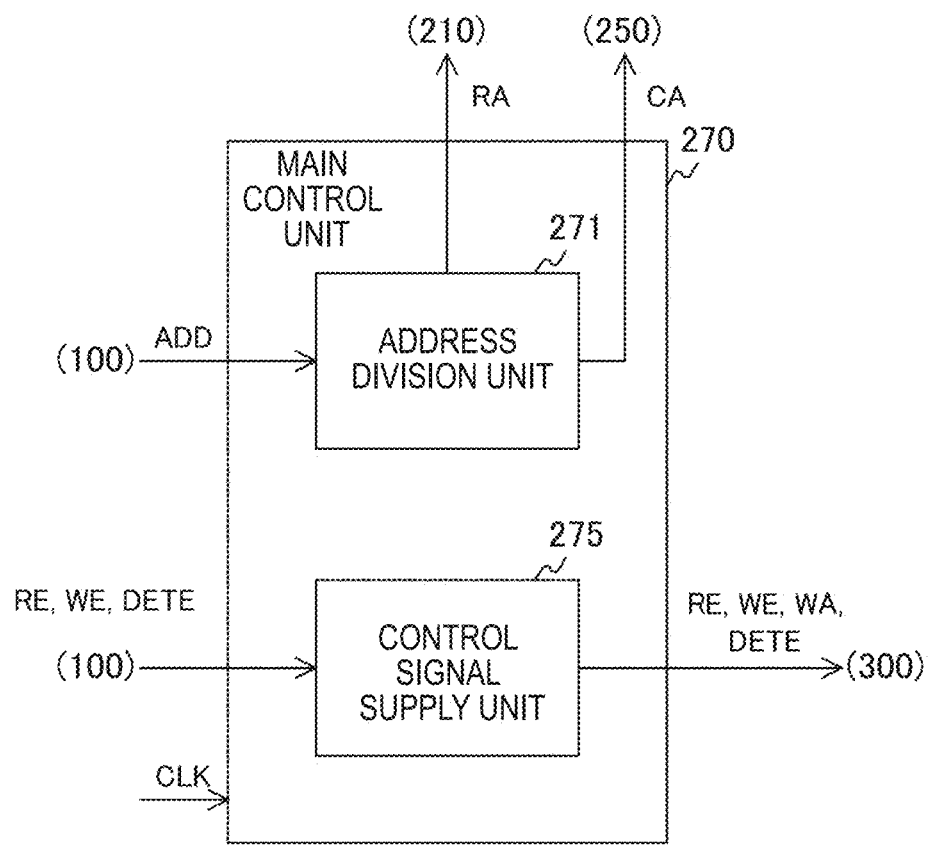
FIG. 25 is a block diagram illustrating a configuration example of a main control unit according to a fourth embodiment of the present technology.

FIG. 25 is a block diagram illustrating a configuration example of a main control unit 270 according to the fourth embodiment. The main control unit 270 according to the fourth embodiment is different from that according to the first embodiment in that the main control unit 270 includes a control signal supply unit 275 instead of the control signal supply unit 272.

A reading enabling signal RE, a writing enabling signal WE, and a detection enabling signal DETE are input to the control signal supply unit 275. The detection enabling signal DETE is a signal indicating that the negative potential detection circuit 450 is to be enabled. In a case in which the negative potential detection circuit 450 and the negative potential clipping circuit 470 are to be enabled, for example, the detection enabling signal DETE is set at the high level. In a case in which the negative potential detection circuit 450 and the negative potential clipping circuit 470 are to be deactivated, the detection enabling signal DETE is set at the low level. A logic circuit 100 deactivates the negative potential detection circuit 450 by the detection enabling signal DETE in a case in which the power source potential VDD is lower than a specific value and otherwise enables the negative potential detection circuit 450.

Figure 26:
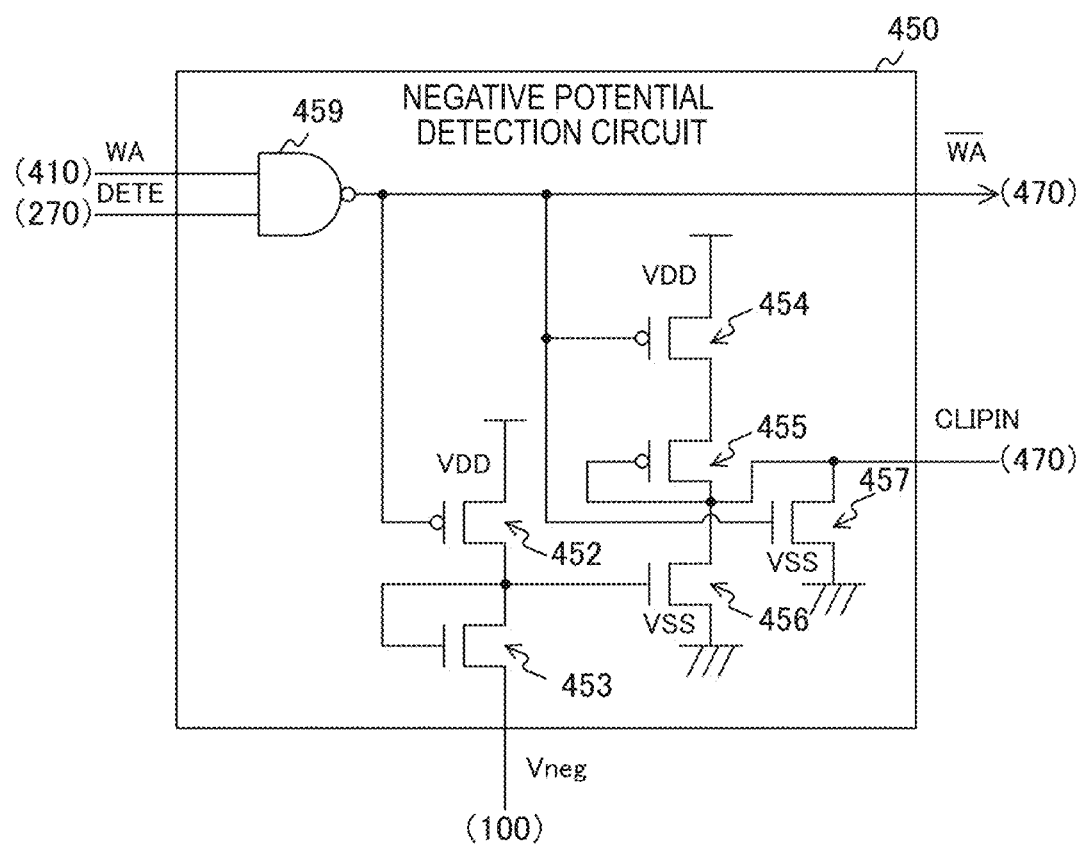
FIG. 26 is a circuit diagram illustrating a configuration example of a negative potential detection circuit according to the fourth embodiment of the present technology.

FIG. 26 is a circuit diagram illustrating a configuration example of the negative potential detection circuit 450 according to the fourth embodiment. The negative potential detection circuit 450 according to the fourth embodiment is different from that according to the first embodiment in that the negative potential detection circuit 450 includes a non-conjunction (NAND) gate 459 instead of the inverter 451.

The NAND gate 459 outputs non-conjunction of the writing assist activation signal WA and the detection enabling signal DETE. In a case in which the detection enabling signal DETE is at the low level, the negative potential detection circuit 450 stops. In addition, since the level of an output form the NAND gate 459 becomes high at that time, the negative potential clipping circuit 470 in a later stage also stops. It is possible to reduce power consumption by these circuits stopping.

Note that although the semiconductor storage device 200 enables or deactivates only the negative potential detection circuit 450 and the negative potential clipping circuit 470 in the writing assist circuit 400 in accordance with the enabling signal, the semiconductor storage device 200 is not limited to this configuration. The semiconductor storage device 200 may enable or deactivate the entire writing assist circuit 400 in accordance with the enabling signal. In addition, the semiconductor storage device 200 may individually enable or deactivate the respective circuits on the basis of enabling signals for the negative potential detection circuit 450 and the negative potential clipping circuit 470 and enabling signals for the other circuits.

According to the fourth embodiment of the present technology, the semiconductor storage device 200 can reduce power consumption in a case in which it is not necessary to cause the negative potential detection circuit 450 to operate since the semiconductor storage device 200 causes the negative potential detection circuit 450 to stop in accordance with the enabling signal as described above.

5. Fifth Embodiment

In the aforementioned first embodiment, the semiconductor storage device 200 causes the charge pump circuits 430 to continuously operate even after the potential of the bit line is fixed. However, since it is not necessary to cause the potential of the bit line to further drop after the fixation of the potential of the bit line, there is a less need to cause the charge pump circuits 430 to operate. Therefore, it is desirable to cause the charge pump circuits 430 to stop after the fixation of the potential of the bit line from the viewpoint of reducing the power consumption. A semiconductor storage device 200 according to a fifth embodiment is different from that according to the first embodiment in that the charge pump circuits 430 are caused to stop in a case in which the potential of the bit lien is fixed.

Figure 27:
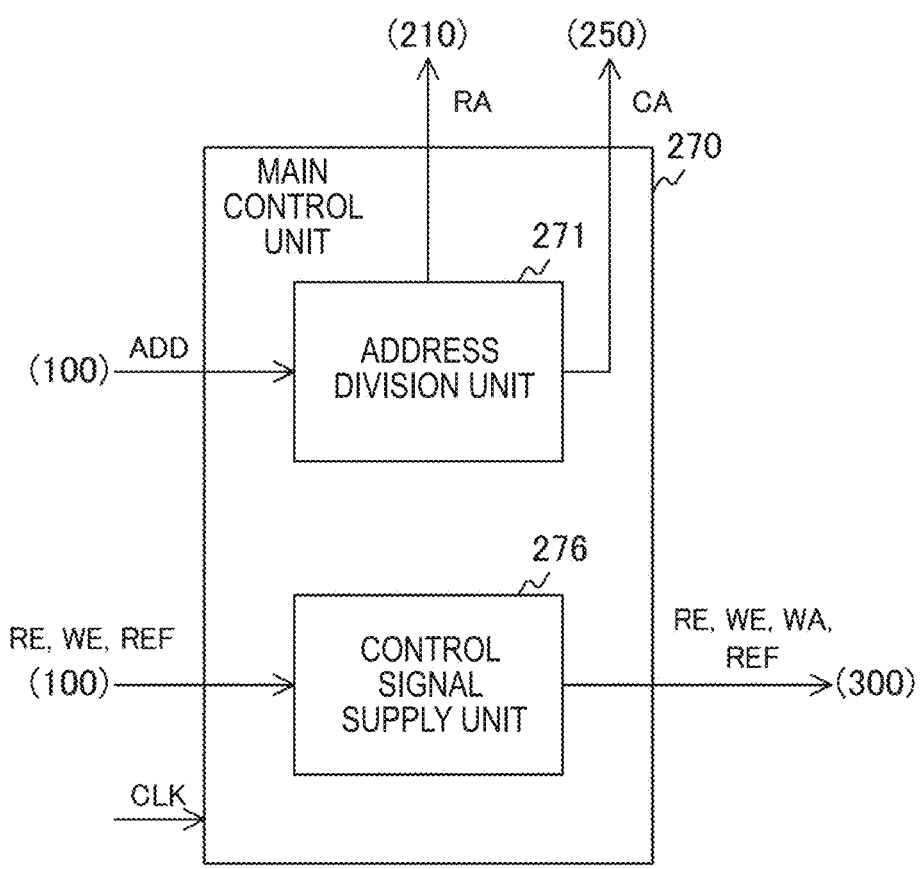
FIG. 27 is a block diagram illustrating a configuration example of a main control unit according to a fifth embodiment of the present technology.

FIG. 27 is a block diagram illustrating a configuration example of a main control unit 270 according to the fifth embodiment. The main control unit 270 according to the fifth embodiment is different from that according to the first embodiment in that the main control unit 270 includes a control signal supply unit 276 instead of the control signal supply unit 272.

A reading enabling signal RE, a writing enabling signal WE, and a reference voltage setting signal REF are input to the control signal supply unit 276. The reference voltage setting signal REF is for setting the voltage of the clip signal CLIPIN when the charge pump circuits 430 are caused to stop as a reference voltage. For example, the reference voltage setting signal REF is a signal of a plurality of bits, among which at least 1 bit is set to "1".

Figure 28:
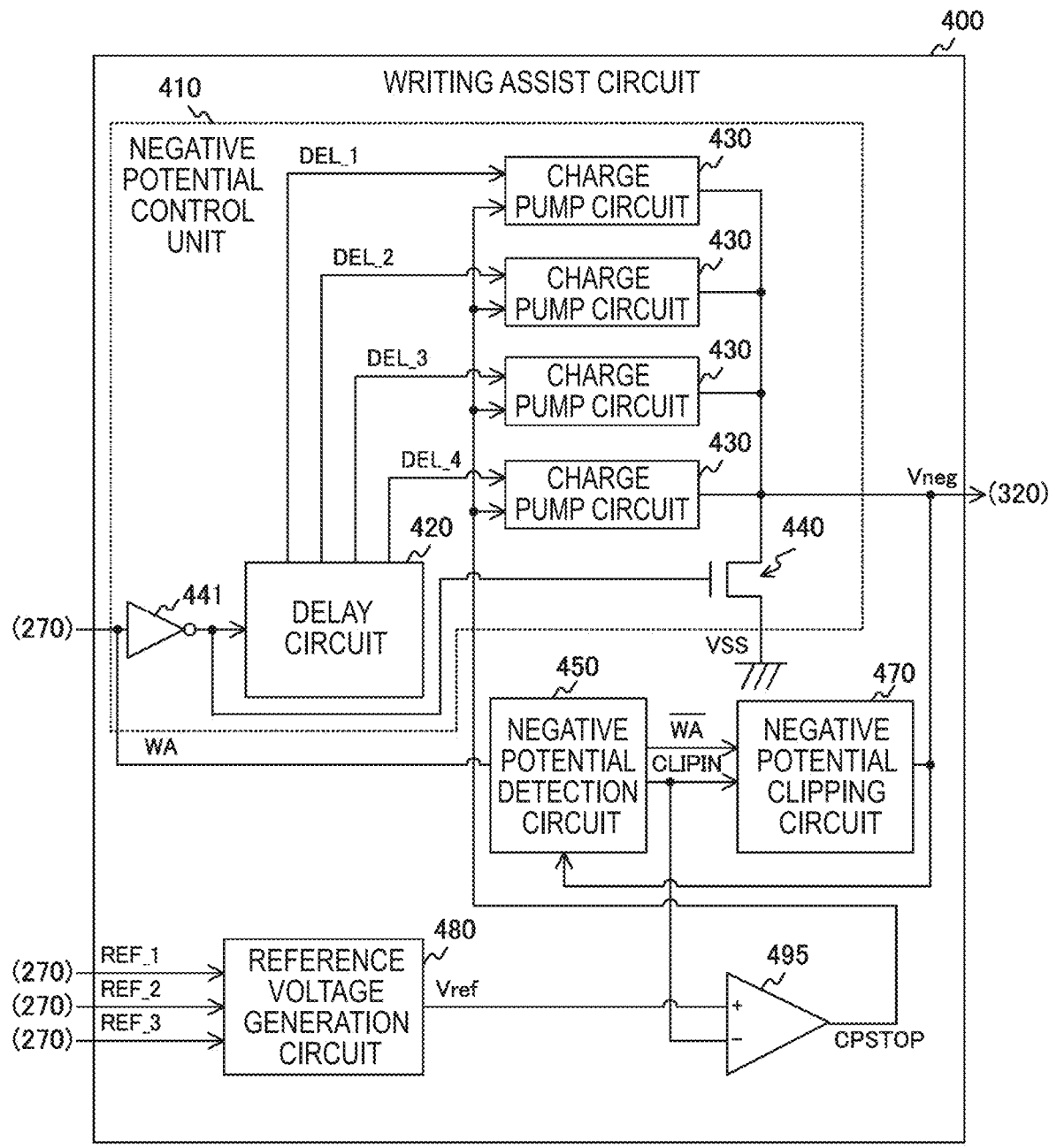
FIG. 28 is a block diagram illustrating a configuration example of a writing assist circuit according to the fifth embodiment of the present technology.

FIG. 28 is a block diagram illustrating a configuration example of a writing assist circuit 400 according to the fifth embodiment. The writing assist circuit 400 according to the fifth embodiment is different from that according to the first embodiment in that the writing assist circuit 400 further includes a reference voltage generation circuit 480 and a comparator 495.

The reference voltage generation circuit 480 generates a reference voltage $V_{ref}$ in accordance with a reference voltage setting signal SET. The reference voltage generation circuit 480 supplies the generated reference voltage $V_{ref}$ to a non-inverted input terminal (+) of the comparator 495.

The comparator 495 compares the level of the detection signal CLIPIN with the reference voltage $V_{ref}$. The detection signal CLIPIN is input to an inverted input terminal (−) of the comparator 495. The comparator 495 supplies the result of the comparison as a stop signal CPSTOP to all the plurality of charge pump circuits 430. The level of the stop signal CPSTOP becomes high in a case in which the detection signal CLIPIN is equal to or greater than a reference voltage $V_{ref}$, and otherwise becomes low. Note that the comparator 495 is an example of the stopping control unit described in the claims.

In addition, the charge pump circuits 430 according to the fifth embodiment is different from those according to the first embodiment in that the charge pump circuits 430 stop in a case in which a stop signal CPSTOP is at the high level (the detection signal LIPIN is equal to or greater than the reference voltage $V_{ref}$).

Figure 29:
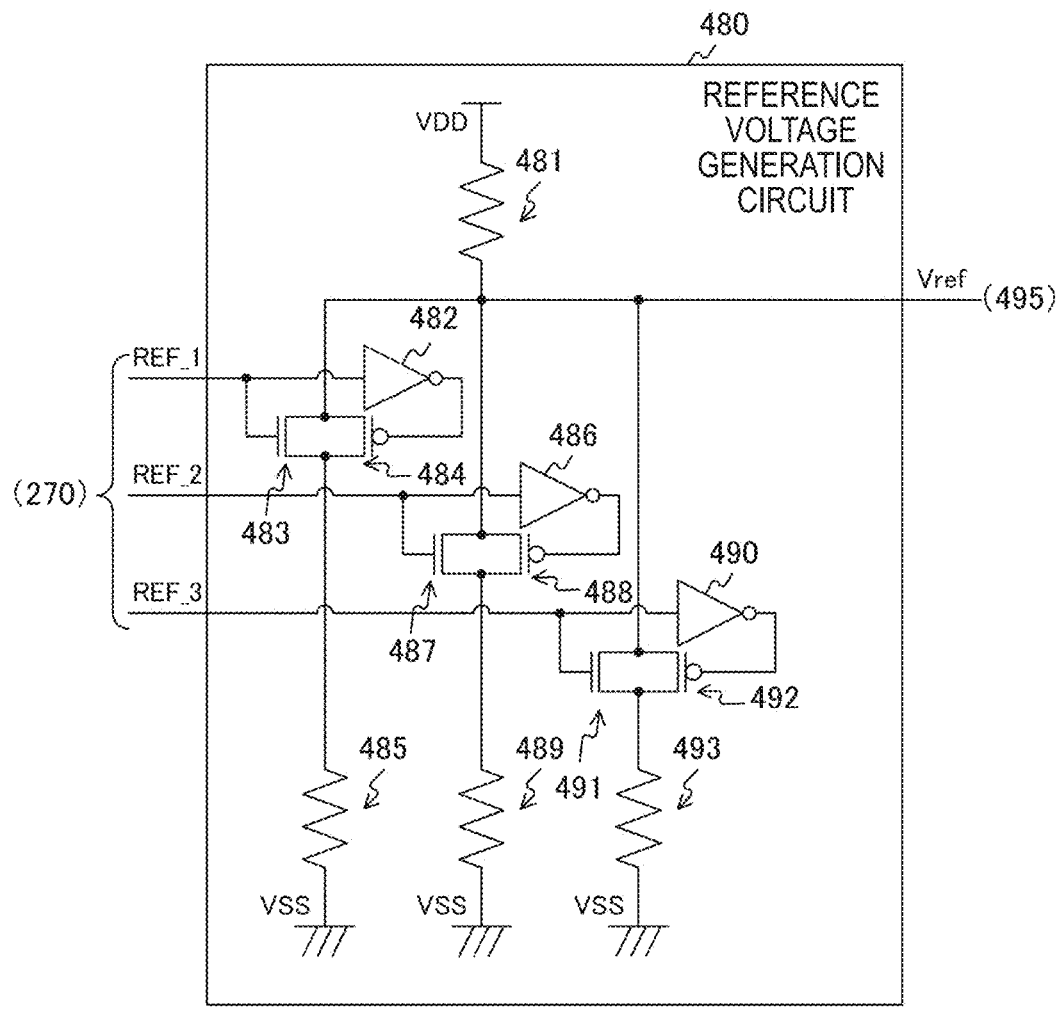
FIG. 29 is a circuit diagram illustrating a configuration example of a reference voltage generation circuit according to the fifth embodiment of the present technology.

FIG. 29 is a circuit diagram illustrating a configuration example of the reference voltage generation circuit 480 according to the fifth embodiment. The reference voltage generation circuit 480 includes resistances 481, 485, 489, and 493, transistors 483, 484, 487, 488, 491, and 492, and inverters 482, 486, and 490. n-type MOS transistors are used as the transistors 483, 487, and 491, and p-type MOS transistors are used as the transistors 484, 488, and 492. In addition, resistance values of the resistances 485, 489, and 493 are assumed to be different from each other.

One end of the resistance 481 is connected to the power source terminal, and a voltage of the other end is output as the reference voltage $V_{ref}$. In addition, the transistors 483 and 484 are connected in parallel between the resistance 481 and the resistance 485. The transistors 487 and 488 are connected in parallel between the resistance 481 and the resistance 489. The transistors 491 and 492 are connected in parallel between the resistance 481 and the resistance 493.

In addition, the first bit REF_1 of the reference voltage setting signal REF is input to a gate of the transistor 483 and the inverter 482. The inverter 482 inverts the bit and outputs the inverted bit to a gate of the transistor 484. The second bit REF_2 of the reference voltage setting signal REF is input to a gate of the transistor 487 and the inverter 486. The inverter 486 inverts the bit and outputs the inverted bit to a gate of the transistor 488. The third bit REF_3 of the reference voltage setting signal REF is input to a gate of the transistor 491 and the inverter 490. The inverter 490 inverts the bit and outputs the inverted bit to a gate of the transistor 492.

With the aforementioned configuration, it is possible to change the connection configuration between the resistances 485, 489, and 493 and the resistance 481 and to thereby adjust the value of the reference voltage $V_{ref}$ by changing the positions and the number of the bit "1" of the reference voltage setting signal REF.

Note that although the semiconductor storage device 200 sets the reference voltage by the 3-bit reference voltage setting signal REF, the reference voltage may be set by a reference voltage setting signal REF of equal to or less than 2 bits or equal to or greater than 4 bits. In this case, the transistors and the resistances in the reference voltage generation circuit 480 may be reduced or added in accordance with the number of bits. In addition, although the reference voltage generation circuit 480 divides the voltage between the power source potential VDD and the reference potential VSS by the resistance, the reference voltage generation circuit 480 may divide the voltage by an element (MOS transistor or the like) other than the resistance.

Figure 30:
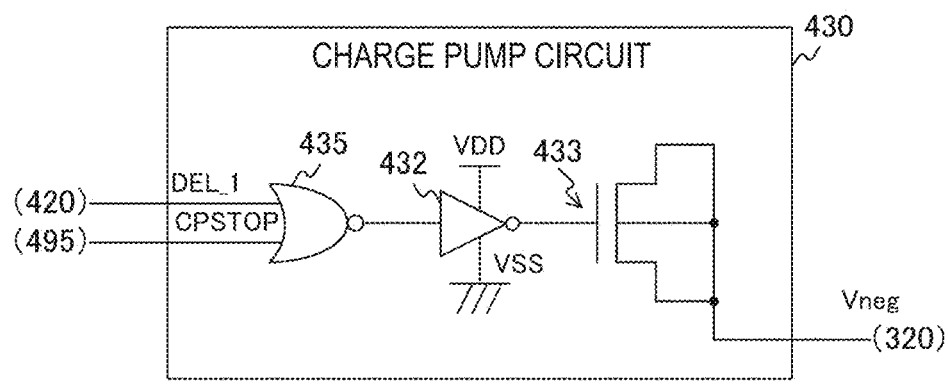
FIG. 30 is a circuit diagram illustrating a configuration example of a charge pump circuit according to the fifth embodiment of the present technology.

FIG. 30 is a circuit diagram illustrating a configuration example of each charge pump circuit 430 according to the fifth embodiment. The charge pump circuit 430 according to the fifth embodiment is different from that according to the first embodiment in that the charge pump circuit 430 includes a negative logical sum (NOR) gate 435 instead of the inverter 431.

The NOR gate 435 supplies a negative logical sum of a delay signal DEL_k and a stop signal CPSTOP to the inverter 432.

With the aforementioned configuration, the charge pump circuit 430 causes the potential of the bit line to drop in accordance with the delay signal DEL_1 in a case in which the stop signal CPSTOP is at the low level. Meanwhile, the charge pump circuit 430 stops controlling the potential of the bit line in a case in which the stop signal CPSTOP is at the high level.

According to the fifth embodiment of the present technology, the semiconductor storage device 200 can reduce power consumption as compared with a configuration in which the charge pump circuits 430 are caused to operate even after the fixation of the potential of the bit line since the semiconductor storage device 200 causes the charge pump circuits 430 to stop in a case in which the semiconductor storage device 200 fixes the potential of the bit line as described above.

The above-described embodiments are examples for embodying the present technology, and matters in the embodiments each have a corresponding relationship with disclosure-specific matters in the claims. Likewise, the matters in the embodiments and the disclosure-specific matters in the claims denoted by the same names have a corresponding relationship with each other. However, the present technology is not limited to the embodiments, and various modifications of the embodiments may be embodied in the scope of the present technology without departing from the spirit of the present technology.

The processing sequences that are described in the embodiments described above may be handled as a method having a series of sequences or may be handled as a program for causing a computer to execute the series of sequences and recording medium storing the program. As the recording medium, a hard disk, a CD (Compact Disc), an MD (Mini-Disc), and a DVD (Digital Versatile Disk), a memory card, and a Blu-ray disc (registered trademark) can be used.

Note that the effects described here are not necessarily limited, and any effect that is described in the present disclosure may be exhibited.

Additionally, the present technology may also be configured as below.

(1)

A semiconductor storage device including:

a first transistor that has a gate connected to a gate signal line and a source connected to a first source signal line;

a second transistor that has a gate connected to the gate signal line and a source connected to a second source signal line;

a storage element that is connected to drains of the first transistor and the second transistor;

a gate signal line potential control unit that controls a potential of the gate signal line such that the potential becomes a predetermined high potential that is higher than a predetermined reference potential in a case in which the storage element is caused to store data;

a source signal line potential control unit that causes one of the potentials of the first source signal line and the second signal line to drop such that the one of the potentials becomes lower than the predetermined reference potential, on a basis of the data; and a potential fixing unit that fixes the one of the potentials at a specific potential in a case in which the one of the potentials has dropped and reached the specific potential that is lower than the predetermined reference potential.

(2)

The semiconductor storage device according to (1), further including:

a detection unit that detects that the one of the potentials has reached the specific potential and supplies a detection signal indicating a result of the detection to the potential fixing unit, in which the potential fixing unit fixes the one of the potentials at the specific potential in a case in which the detection signal is supplied.

(3)

The semiconductor storage device according to (2), in which the source signal line potential control unit includes a first charge pump circuit that uses a first capacitance connected to the first source signal line and the second source signal line to cause the one of the potentials to drop if an instruction signal for providing an instruction for dropping the potential of the first source signal line or the second source signal line is supplied, and a second charge pump circuit that uses a second capacitance connected to the first source signal line and the second source signal line to cause the one of the potentials to drop if a delay signal obtained by causing the instruction signal to be delayed is supplied.

(4)

The semiconductor storage device according to (3), in which the first charge pump circuit causes the one of the potentials to drop if a first charge pump enabling signal indicating that the first charge pump circuit is to be enabled and the instruction signal are supplied, and the second charge pump circuit causes the one of the potential to drop if a second charge pump enabling signal indicating that the second charge pump circuit is to be enabled and the delay signal are supplied.

(5)

The semiconductor storage device according to (3) or (4), in which the detection unit adjusts a value of the specific potential on a basis of an adjustment signal indicating an adjusted value of the specific potential.

(6)

The semiconductor storage device according to any of (3) to (5), in which the detection unit detects that the one of the potentials has reached the specific potential in a case in which a detection enabling signal indicating that the detection unit is to be enabled is supplied.

(7)

The semiconductor storage device according to any of (3) to (6), further including:

a stop control unit that causes the first charge pump circuit and the second charge pump circuit to stop in a case in which the potential of the first source signal line or the second source signal line has reached the specific potential.

(8)

The semiconductor storage device according to any of (3) to (7), in which the first capacitance and the second capacitance are metal oxide semiconductor (MOS) capacitors.

(9)

A method of controlling a semiconductor storage device, the method including:

a gate signal line potential control procedure in which a potential of a gate signal line is controlled such that the potential becomes a predetermined high potential that is higher than a predetermined reference potential in a case in which a storage element that is connected to each of drains of a first transistor that has a gate connected to the gate signal line and a source connected to a first source signal line and a second transistor that has a gate connected to the gate signal line and a source connected to a second source signal line is caused to store data;

a source signal line potential control procedure in which one of potentials of the first source signal line and the second source signal line is caused to drop such that the one of the potentials becomes lower than the predetermined reference potential on a basis of the data; and a potential fixation process in which the one of the potentials is fixed at a specific potential in a case in which the one of the potentials has dropped and reached the specific potential that is lower than the predetermined reference potential.

REFERENCE SIGNS LIST 100 logic circuit
200 semiconductor storage device
210 row address decoder
220 word control unit
230 memory cell array
240 memory cell
241, 244, 261 to 264, 325 to 328, 433, 440, 452 to 457, 460 to 464, 472 to 475, 483, 484, 487, 488, 491, 492 transistor
242, 243, 321, 322, 421 to 428, 431, 432, 441, 451, 471, 482, 486, 490 inverter
250 column address decoder
260 column control unit
270 main control unit
271 address division unit
272, 273, 274, 275, 276 control signal supply unit
300 input and output control unit
310 input and output control circuit
320 writing control circuit
323, 324 negative logical sum (NOR) gate
330 reading control circuit
400 writing assist circuit
410 negative potential control unit
420 delay circuit
430 charge pump circuit
434, 459 non-conjunction (NAND) gate
435 negative logical sum (NOR) gate
450 negative potential detection circuit
470 negative potential clipping circuit
480 reference voltage generation circuit
481, 485, 489, 493 resistance
495 comparator

The invention claimed is:

1. A semiconductor storage device, comprising:
a first transistor that includes:
a first gate connected to a gate signal line, and
a first source connected to a first source signal line;
a second transistor that includes:
a second gate connected to the gate signal line, and
a second source connected to a second source signal line;
a storage element connected to a drain of the first transistor and a drain of the second transistor, wherein the storage element is configured to store data;
a gate signal line potential control unit configured to control, based on the data, a potential of the gate signal line such that the potential of the gate signal line is higher than a reference potential;
a source signal line potential control unit configured to drop, based on the data, one of a potential of the first source signal line or a potential of the second source signal line such that one of the potential of the first source signal line or the potential of the second source signal line is lower than the reference potential, wherein
the source signal line potential control unit includes a first charge pump circuit and a second charge pump circuit,
the first charge pump circuit includes a first capacitance connected to the first source signal line and the second source signal line,
the first charge pump circuit is configured to drop one of the potential of the first source signal line or the potential of the second source signal line, based on the first capacitance and an instruction signal indicating an instruction to drop one of the potential of the first source signal line or the potential of the second source signal line,
the second charge pump circuit includes a second capacitance connected to the first source signal line and the second source signal line,
the second charge pump circuit is configured to drop one of the potential of the first source signal line or the potential of the second source signal line, based on the second capacitance and a delay signal, and
the delay signal is associated with a delay in the instruction signal; and
a potential fixing unit configured to fix one of the potential of the first source signal line or the potential of the second source signal line at a specific potential based on the drop in one of the potential of the first source signal line or the potential of the second source signal line,
wherein the specific potential is lower than the reference potential.

2. The semiconductor storage device according to claim 1, further comprising:
a detection unit configured to:
detect that one of the potential of the first source signal line or the potential of the second source signal line is at the specific potential; and
supply a detection signal indicating a result of the detection to the potential fixing unit,
wherein the potential fixing unit is further configured to fix one of the potential of the first source signal line or the potential of the second source signal line at the specific potential based on the supplied detection signal.

3. The semiconductor storage device according to claim 2, wherein the detection unit is further configured to adjust a value of the specific potential based on an adjustment signal indicating an adjusted value of the specific potential.

4. The semiconductor storage device according to claim 2, wherein the detection unit is further configured to detect that one of the potential of the first source signal line or the potential of the second source signal line is at the specific potential based on a detection enabling signal indicating enablement of the detection unit.

5. The semiconductor storage device according to claim 1, wherein
the first charge pump circuit is further configured to drop one of the potential of the first source signal line or the potential of the second source signal line based on a first charge pump enabling signal and the instruction signal,
the first charge pump enabling signal indicates enablement of the first charge pump circuit,
the second charge pump circuit is further configured to drop one of the potential of the first source signal line or the potential of the second source signal line based on a second charge pump enabling signal and the delay signal, and
the second charge pump enabling signal indicates enablement of the second charge pump circuit.

6. The semiconductor storage device according to claim 1, further comprising a stop control unit configured to stop the first charge pump circuit and the second charge pump circuit based on one of the potential of the first source signal line or the potential of the second source signal line that is at the specific potential.

7. The semiconductor storage device according to claim 1, wherein the first capacitance and the second capacitance correspond to metal oxide semiconductor (MOS) capacitors.

8. A method of controlling a semiconductor storage device, the method comprising:
in the semiconductor storage device that includes a gate signal line potential control unit, a storage element, a first transistor, a second transistor, a source signal line potential control unit, and a potential fixing unit:
storing data in the storage element;
controlling, by the gate signal line potential control unit, based on the data, a potential of a gate signal line such that the potential of the gate signal line is higher than a reference potential, wherein
the storage element is connected to a drain of the first transistor and a drain of the second transistor,
the first transistor includes a first gate connected to the gate signal line and a first source connected to a first source signal line, and
the second transistor includes a second gate connected to the gate signal line and a second source connected to a second source signal line;
dropping, by the source signal line potential control unit, based on the data, one of a potential of the first source signal line or a potential of the second source signal line such that one of the potential of the first source signal line or the potential of the second source signal line is lower than the reference potential, wherein
the source signal line potential control unit includes a first charge pump circuit and a second charge pump circuit,
the first charge pump circuit includes a first capacitance connected to the first source signal line and the second source signal line,
the first charge pump circuit is configured to drop one of the potential of the first source signal line or the potential of the second source signal line, based on the first capacitance and an instruction signal indicating an instruction to drop one of the potential of the first source signal line or the potential of the second source signal line,
the second charge pump circuit includes a second capacitance connected to the first source signal line and the second source signal line,
the second charge pump circuit is configured to drop one of the potential of the first source signal line or the potential of the second source signal line, based on the second capacitance and a delay signal, and
the delay signal is associated with a delay in the instruction signal; and
fixing, by the potential fixing unit, one of the potential of the first source signal line or the potential of the second source signal line at a specific potential based on the drop in one of the potential of the first source signal line or the potential of the second source signal line,
wherein the specific potential is lower than the reference potential.

* * * * *